US009225308B2

(12) United States Patent
Langer et al.

(10) Patent No.: US 9,225,308 B2
(45) Date of Patent: Dec. 29, 2015

(54) APPARATUS AND METHOD FOR AMPLIFYING A TRANSMIT SIGNAL OR FOR DETERMINING VALUES OF A DELAY CONTROL PARAMETER

(71) Applicant: Intel IP Corporation, Santa Clara, CA (US)

(72) Inventors: Andreas Langer, Lohhof (DE); Gunther Kraut, Egmating (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/611,409

(22) Filed: Feb. 2, 2015

(65) Prior Publication Data

US 2015/0280674 A1    Oct. 1, 2015

(30) Foreign Application Priority Data

Mar. 28, 2014    (DE) .................. 10 2014 104 371

(51) Int. Cl.
*H04B 1/04* (2006.01)
*H03G 3/30* (2006.01)

(52) U.S. Cl.
CPC .................................. *H03G 3/3042* (2013.01)

(58) Field of Classification Search
CPC ... H03F 1/0216; H03F 1/0222; H03F 1/0227; H03F 1/0233; H03F 1/0238; H03F 1/3241; H03F 1/3247; H03F 1/3282; H03F 1/3294; H04B 1/04; H04B 1/0475; H04B 2001/0416; H04B 2001/045; H04B 2001/0433
See application file for complete search history.

(56) References Cited

U.S. PATENT DOCUMENTS

| | | | |
|---|---|---|---|
| 7,602,244 B1 * | 10/2009 | Holmes et al. ................ | 330/149 |
| 8,605,774 B2 | 12/2013 | Rupp et al. | |
| 2005/0079835 A1 * | 4/2005 | Takabayashi et al. ..... | 455/127.1 |
| 2006/0234652 A1 | 10/2006 | Oka | |
| 2010/0027445 A1 | 2/2010 | Matsuura | |
| 2012/0223777 A1 | 9/2012 | Drogi et al. | |
| 2013/0034139 A1 | 2/2013 | Khlat et al. | |
| 2013/0076418 A1 | 3/2013 | Belitzer et al. | |
| 2013/0109441 A1 * | 5/2013 | Lorenz et al. ................ | 455/571 |
| 2013/0231069 A1 | 9/2013 | Drogi et al. | |
| 2014/0070787 A1 * | 3/2014 | Arno ............................ | 323/304 |
| 2014/0106690 A1 * | 4/2014 | Nentwig ................... | 455/114.2 |
| 2015/0035606 A1 * | 2/2015 | Bartram ...................... | 330/297 |
| 2015/0111511 A1 * | 4/2015 | Yamanouchi .............. | 455/127.2 |

OTHER PUBLICATIONS

Open-ET Alliance. "Understanding the Technology That's Empowering Efficient Transmitters"; Published in 2011, Retrieved from http://www.open-et.org/intro-to-et-pa-712.php?c=1.

(Continued)

*Primary Examiner* — Siu Lee
(74) *Attorney, Agent, or Firm* — Eschweiler & Associates, LLC

(57) ABSTRACT

An apparatus for amplifying a transmit signal comprises a transmit path comprising a power amplifier module to be coupled to an antenna module. The power amplifier module is configured to amplify a transmit signal. Further, the apparatus comprises an envelope tracking path comprising a variable delay module and a power supply module. The variable delay module is configured to vary a signal delay within the envelope tracking path according to a delay control parameter. Further, the apparatus comprises a delay control module configured to provide the delay control parameter based on a current characteristic transmit frequency of the transmit signal.

20 Claims, 15 Drawing Sheets

(56) References Cited

OTHER PUBLICATIONS

U.S. Appl. No. 14/663,640, filed with the USPTO on Mar. 20, 2015.
U.S. Appl. No. 14/619,425, filed Feb. 11, 2015.
English translation of German Office Action dated Aug. 25, 2014 for copending German Application No. 10 2014 104 372.3.
English translation of German Office Action dated Dec. 15, 2014 for copending German Application No. 10 2014 104 371.5.

* cited by examiner

APPARATUS AND METHOD FOR AMPLIFYING A TRANSMIT SIGNAL OR FOR DETERMINING VALUES OF A DELAY CONTROL PARAMETER

TECHNICAL FIELD

The present disclosure relates to the amplification of signals to be transmitted and in particular to an apparatus and a method for amplifying a transmit signal and an apparatus and a method for determining values of a delay control parameter.

BACKGROUND

The transmission of data between two devices is required in many applications. For such transmissions, transmit signals are often amplified before the transmission to a receiver device. The amplification of a transmit signal is a challenging task. At one hand a desired transmission power should be reached, while the current consumption should be low. An efficient way to optimize the power amplifier (PA) current consumption in a wireless system across the entire output power range is the use of a DCDC converter (Direct Current-Direct Current converter) which provides the PA supply voltage, for example. Depending on the output power, the output voltage of the DCDC converter is adjusted. The lower the output power is, the lower is the required PA supply voltage. Due to the voltage conversion from the battery voltage down to lower PA supply voltage, the battery current may be reduced. For example, the DCDC converter output voltage may be set based on the target power (average power) which is expected in the next period of time. This procedure may be called Average power tracking (APT). However, it is desired to further reduce the current consumption.

SUMMARY

There is a potential demand to provide an improved concept for amplifying a transmit signal.

This demand may be satisfied by the subject matter of the claims.

BRIEF DESCRIPTION OF THE DRAWINGS

Some examples of apparatuses and/or methods will be described in the following by way of example only, and with reference to the accompanying figures, in which.

DETAILED DESCRIPTION

Figure 1:
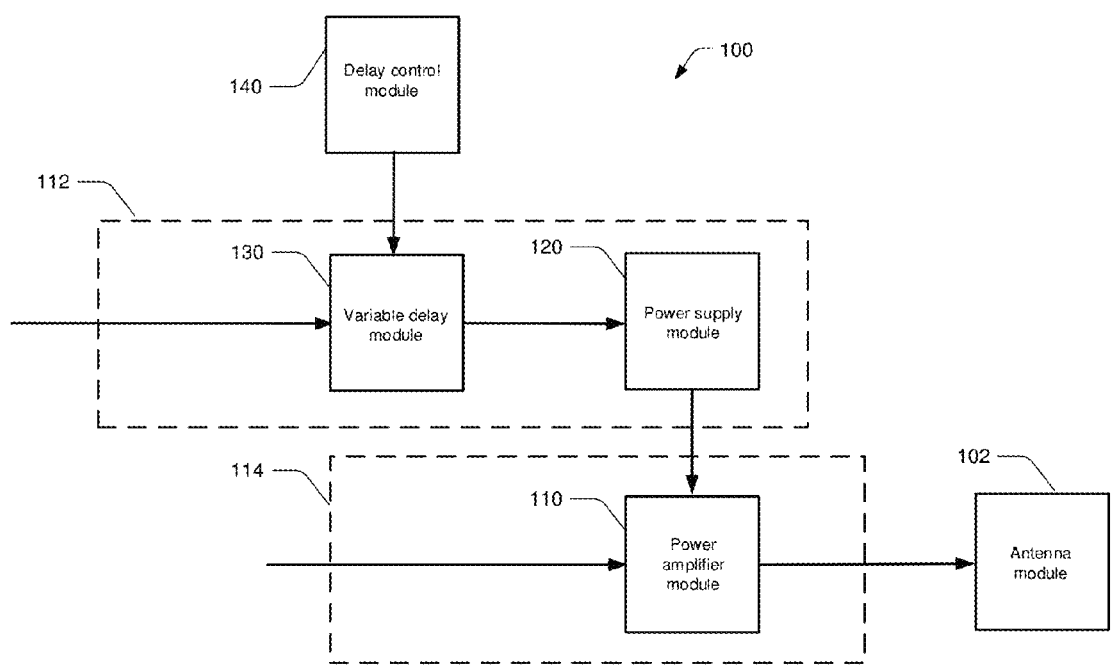
FIG. 1 shows a block diagram of an apparatus for amplifying a transmit signal with a variable delay module and a delay control module.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

The power consumption of the amplification of transmit signals may be reduced by using an enveloped tracking approach. Enveloped tracking is an approach in which the power supply voltage applied to the power amplifier is repeatedly or continuously adjusted to enable that the amplifier operates close to the peak efficiency for a given instantaneous output power requirement, for example. An envelope detector or envelope tracking module may calculate the instantaneous amplitude of the signal to be transmitted and a supply modulator (e.g. comprising a fast DCDC converter) may convert that amplitude signal in a supply voltage for the power amplifier. The supply voltage to the power amplifier may continuously track the envelope of the transmit signal. In this way, the current consumption may be reduced.

Figure 14:
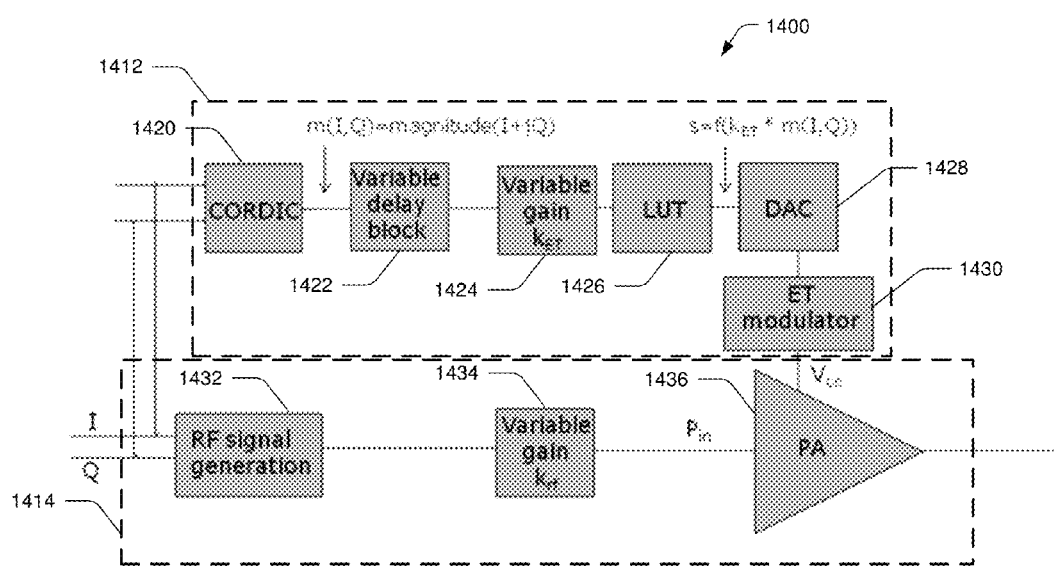
FIG. 14 shows a block diagram of an apparatus for amplifying a transmit signal with a transmit path and an enveloped tracking path.

For example, fast DCDC converters, so called envelope tracking (ET) DCDC converters or envelope tracking modulators may help to further reduce the battery current or current consumption. One aspect of the envelope tracking (ET) is that the supply voltage to the PA is not constant. FIG. 14 shows a block diagram of an apparatus for amplifying a transmit signal using an enveloped tracking approach. The apparatus 1400 comprises an envelope tracking path 1412 and a transmit path 1414. The transmit path 1414 comprises an RF (Radio frequency) signal generation module 1432 coupled to a variable gain module 1434 coupled to a power amplifier module 1436. The envelope tracking path 1412 comprises a coordinate conversion module 1420 (e.g. CORDIC coordinate rotation digital computer) coupled to a variable delay block 1422 coupled to a variable gain module 1424 coupled to a memory unit 1426 (e.g. storing a Look Up Table, LUT) coupled to a Digital to Analog Converter 1428 (DAC) coupled to an envelope tracking ET modulator 1430 (e.g. comprising a DCDC converter) coupled to the power amplifier module 1436.

For example, a baseband transmit signal (e.g. in phase-quadrature signal IQ or polar modulated signal) as provided to the RF signal generation module 1432 of the transmit path 1414 and to the coordinate transformation module 1420 of the envelope tracking path 1412 (e.g. may be removed if the baseband transmit signal is a polar modulated signal). The RF signal generation module 1432 converts the baseband transmit signal to a high frequency transmit signal (e.g. up-converting or mixing the baseband transmit signal with a carrier signal) and the variable gain module 1434 amplifies or attenuates the high frequency transmit signal by a variable gain factor $k_{rf}$. The transmit signal outputted by the variable gain module 1434 is provided to an input of the power amplifier module 1436 with an input power Pin and is amplified by the power amplifier module 1436 based on a supply voltage Vcc provided by the ET modulator module 1430 of the envelope tracking path 1412. The coordinate conversion module 1420 converts the inphase-quadrature baseband transmit signal to a polar modulated baseband transmit signal. The variable delay block 1422 varies a signal delay within the envelope tracking path 1412. Further, the variable gain module 1424 compensates at least partly the variable gain introduced within the transmit path 1414 by amplifying or attenuating a signal within the envelope tracking path 1412 by a gain factor $k_{ET}$ (e.g. depending on the gain factor $k_{rf}$). Further, a Look Up Table stored by a memory module 1426 can provide a control signal or control parameters (e.g. $s=f(k_{ET}*m(I,Q))$) for adjusting a supply voltage provided by the ET modulator module 1430 depending on an amplitude or magnitude of the baseband transmit signal (e.g.) $m(I,Q)=magnitude(I+jQ)$). The output of the memory unit 1426 may be Digital to Analog converted by the Digital to Analog converter 1428 and the analog signal may be provided to the ET modulator module 1430.

The PA supply voltage Vcc depends on the instantaneous envelope of the modulated baseband BB signal m (I,Q), for example. In a schematic description, the envelope of the modulated BB signal may be calculated by means of a CORDIC algorithm, followed by delay adjustment to compensate a different delay in main signal path (RF signal generation path or transmit path) and envelope path, and envelope signal may be shaped (pre-distorted) and afterwards Digital to Analog converted, for example. This signal may be applied to the ET DCDC converter (e.g. ultra-fast DCDC converter) which may generate the variable PA supply voltage.

An ET capable DCDC converter (also called tracker) may follow the instantaneous envelope of the RF signal which may remove the voltage head room and may further increase the system efficiency (e.g. composite efficiency of PA and DCDC converter). For example, an ET capable DCDC converter may reduce the battery current drawn by a power amplifier to amplify an LTE (Long Term Evolution) signal by roughly 20+% at maximum output power relative to the standards DCDC converter which simply follows the average power, for example.

In the ET transmission system a delay between ET path and RF path may be adjusted (e.g. by the variable delay block shown in FIG. 14). A calibration procedure (e.g. using a test transmit signal) during fabrication of the transmitter or mobile may try to equal the analog and digital delays in both paths.

This calibration may be done once during fabrication and the delay within the envelope tracking path may be kept constant during normal operation and during transmission of a transmit signal to an external receiver.

However, this delay calibration may be executed for 50Ω conditions (e.g. ideal conditions) at the antenna port, for example. The antenna load mismatch may have an effect on the optimum ET delay there. This may be the case although the mismatch is applied after the actual combination point of RF envelope and PA supply (at the power amplifier module). It is often not only the antenna which might cause some mismatch at the PA output, it may be generally introduced by all components following the PA such as the duplexer, for example. The duplexer may be especially critical because its input impedance (=load to the PA) may heavily change in magnitude and phase over frequency. This varying load may be the dominant effect causing timing mismatch between RF envelope and modulated PA supply voltage, eventually leading to an ACLR (adjacent channel leakage power ratio) degradation.

In other words, such an effect may occur in an ET system, if a power amplifier is loaded by a duplexer or any other element which adds a frequency-dependent phase shift between forward and reflected wave or provides an impedance to the power amplifier with a rapidly changing phase across frequency, for example.

One aspect of envelope tracking is a tight time synchronization of RF envelope and instantaneous power amplifier supply voltage which is a function of the instantaneous RF envelope, for example. For LTE-20 the delay accuracy may be about 1 ns, for example. If the delay accuracy is violated the ACLR performance may be degraded and memory effects may be introduced in the transmitter chain.

The delay between the RF envelope and instantaneous power amplifier supply voltage may depend on many contributions e.g. delay in RF signal path, delay in ET signal path, delay in the ET DCDC converter (tracker). These contributions may be captured by a factory calibration to account for sample variations and temperature compensation to account for a delay drift over temperature, for example.

The delay between RF envelope and instantaneous power amplifier supply voltage may be called ET delay. The ET delay may be distinguished from the RF group delay which may be caused by a frequency-dependent phase shift (formula) introducing an offset delay in the RF envelope.

If the PA is loaded by a duplexer or any other element providing input impedance with a rapidly changing phase and magnitude across frequency the ET delay might depend on the transmit frequency, for example. The ET delay even might change within the modulation bandwidth. The frequency-dependent ET delay may be called delay dispersion. The root cause of the delay dispersion may be a harmful interaction between the ET system (PA and ET DCDC converter) and duplexer which may be described in detail later on.

The delay dispersion due to the duplexer may be a critical issue for ET deployment. This may be a functional effect in the field of envelope tracking.

In other words, if the PA is loaded by a duplexer (or any element which adds a frequency-dependent phase shift between forward and reflected wave) a delay may depend on frequency due to resonances in the transmit filter of the duplexer, for example. The delay even might change within the modulation bandwidth.

Figure 15:
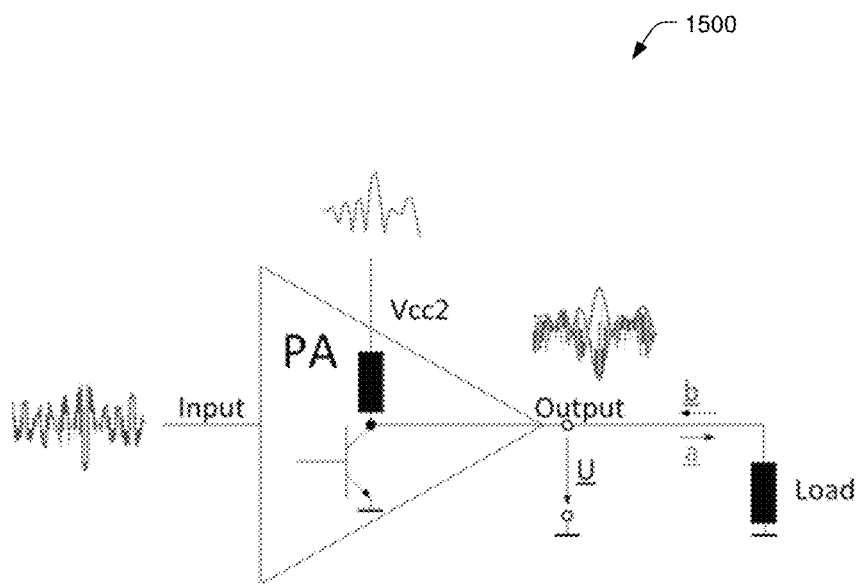
FIG. 15 shows a schematic illustration of an output stage of a power amplifier.

FIG. 15 shows a schematic illustration of a power amplifier 1500 with an RF input, a supply voltage Vcc2 with modulating envelope and an output signal. As depicted, the modulated supply voltage Vcc2 is applied to the collector of the last stage of the power amplifier, where also the output RF signal is taken from. At this point, the power amplifier supply voltage generated by the envelope tracking path may be high enough and properly aligned in time to transmit the amplified RF envelope without or with negligible distortions. If the load is not equal to the reference impedance, reflected waves in addition to the forward wave may be observed at the PA output. The resulting complex voltage U depending on the complex forward wave a, the complex reflected wave b and positive, real reference impedance may be:

$$U = \sqrt{R}(a+b) \qquad (1)$$

With the definition of the complex reflection coefficient r in polar representation (magnitude $r=|r|$ and phase $\tan\phi=\mathrm{Im}\{r\}/\mathrm{Re}\{r\}$) may be:

$$\underline{r} = r \cdot e^{j\varphi} = \frac{b}{a} \qquad (2)$$

and equation 1 become $$U = a\sqrt{R} \cdot (1 + r \cdot e^{j\phi}) = a\sqrt{R} \cdot (1 + r\cos\phi + j \cdot r\sin\phi) \qquad (3)$$

The frequency dependency of the reflection factor may be considered within equation 2 as function of frequency f:

$$r(f) = r(f) \cdot e^{j\phi(f)} \qquad (4)$$

The complex transfer function h(f) may follow from equation 3 and 4 as:

$$h(f) = \frac{U(f)}{a\sqrt{R}} = 1 + r(f)e^{j\varphi(f)} \qquad (5)$$

The amplitude response may be:

$$|h(f)| = \sqrt{1 + r^2(f) + 2r(f)\cos\phi(f)}, \qquad (6)$$

Further, for the phase response $\alpha = \arg(h(f))$ the following may hold:

$$\tan\alpha(f) = \frac{r(f)\sin\varphi(f)}{1 + r(f)\cos\varphi(f)} \qquad (7)$$

The delay of the envelope may be the group delay $T_{gr}$:

$$\tau_{gr} = -\frac{1}{2\pi}\frac{d\alpha(f)}{df} \qquad (8)$$

With equation 7, the group delay may be:

$$\tau_{gr} = -\frac{1}{2\pi}\frac{r' \cdot \sin\varphi + \varphi' \cdot r \cdot (\cos\varphi + r)}{1 + r^2 + 2r\cos\varphi} \qquad (9)$$

This may mean that only for the case of a constant reflection factor over the band ($r'=\phi'=0$) the group delay may be 0. For a duplexer this demand cannot be fulfilled, for example, so regions, where the complex reflection factor heavily changes, a special treatment may be required. The group delay according to equation 9 is not the group delay which is given by s-parameter S21 group delay, for example. The effect described above is caused by S11 group delay, meaning a group delay caused by reflection at the input of the duplexer. The S11 group delay, which is normally not of interest in an RF system, may cause several delay issues and subsequent performance degradation in an ET system, for example.

FIG. 1 shows a block diagram of an apparatus 100 for amplifying a transmit signal according to an example. The apparatus 100 comprises a transmit path 114 and an envelope tracking path 112. A power amplifier module 110 is arranged within the transmit path 114 and a variable delay module 130 and a power supply module 120 are arranged within the envelope tracking path 112. The power amplifier module 110 is configured to be coupled or is coupled to an antenna module 102. The variable delay module 130 varies as signal delay within the envelope tracking path 112 according to at least one delay control parameter. Further, the power supply module 120 varies a power supply of the power amplifier module 110 with a temporal alignment adjustable by the variable delay module 130. The apparatus 100 further comprises a delay control module coupled or connected to the variable delay module 130. The delay control module provides a value of the delay control parameter based on a current characteristic transmit frequency of the transmit signal.

By varying a delay of signals within the envelope tracking path, the synchronization of the variation of the supply voltage of the power amplifier module to a variation of the envelope of the transmit signal (e.g. current amplitude of the transmit signal) can be implemented very accurately. Due to an accurate time alignment of the provided power supply with a desired output amplitude of the power amplifier module distortions of the amplified transmit signal and/or the current consumption may be kept low.

The transmit signal may be a high frequency transmit signal obtained by an up-conversion of a baseband transmit signal (e.g. inphase-quadrature phase signal or polar modulated signal). The transmit signal is amplified by the power amplifier module 110 and the amplified transmit signal may be provided to an antenna module 102.

The antenna module 102 may be connected to the transmit path 114 or the power amplifier module 110 and may be a part of the apparatus 100. Alternatively, the antenna module 102 may be an external part connectable to the apparatus 100. The antenna module 102 may comprise various components (e.g. duplexer, antenna switch and/or one or more antennas).

The power amplifier module 110 may amplify the transmit signal depending on a voltage supplied by the power supply module 120. The power amplifier module 110 may comprise one or more amplifier stages (power amplifier core) and an impedance matching circuitry, for example.

The apparatus 100 may be implemented within a transmitter or transceiver for amplifying signals to be transmitted by the transmitter or transceiver, for example.

The envelope tracking path 112 is a signal path used to control and/or provide the supply voltage of the power amplifier module 110. In comparison, the transmit path 114 is a signal path for propagating signals or data to be transmitted to a receiver.

The power supply module 120 of the power amplifier module 110 is arranged within the envelope tracking path 112. The power supply module 120 is able to generate a power supply (e.g. power supply voltage or power supply current) of the power amplifier module 110 varying in time. In this way, an envelope tracking approach (e.g. as described in connection with FIGS. 14 and 15) can be implemented in order to reduce the power consumption of the amplification of the transmit signal, for example.

Additionally, a variable delay module 130 is arranged within the envelope tracking path 112 to improve the temporal alignment of the variation of the power supply to a variation of the signal to be amplified. The variable delay module 130 varies a signal delay within the envelope tracking path 112 in response to a delay control parameter provided to the variable delay module 130. Due to the variation of the signal delay within the envelope tracking path 112, the time alignment of the power supply of the power amplifier module 110 may be adjustable to a variable signal delay difference between the transmit path 114 and the envelope tracking path 112.

The variable delay module 130 may provide the possibility to vary the signal delay within the envelope tracking path 112 during normal operation of a transmitter or a transceiver. In other words, the variable delay module 130 may vary the signal delay within the envelope tracking path 112 during transmission of the transmit signal (e.g. to an external receiver). The transmit signal may contain user data to be transmitted from the transmitter or transceiver using the apparatus 100 to an external receiver, for example.

The transmit signal may comprise an amplitude and phase varying over time according to a sequence of symbols (e.g. each symbol representing data to be transmitted) to be transmitted. The transmit signal may be transmitted through a selected transmit band and/or resource blocks of a transmit band, for example. The transmit band and/or the resource blocks of the transmit band used for transmitting the transmit signal may vary over time.

The at least one delay control parameter may be defined in various ways or may represent various parameters or coefficients. For example, the delay control parameter may be a currently desired signal delay to be generated by the variable delay module or information representing a currently desired signal delay or a signal property (e.g. voltage or current of a delay control signal provided to the variable delay module) proportional to a currently desired signal delay.

The delay control module 140 provides and/or determines the delay control parameter for controlling the variable delay module 130 based on a current characteristic transmit frequency of the transmit signal. The current characteristic transmit frequency may indicate a frequency representative or characteristic for a frequency range currently used for transmitting the transmit signal. The frequency range used for transmitting a transmit signal may depend on the wireless communication standard or protocol used for the transmission of the transmit signal (e.g. LTE, Long Term Evolution, 3GPP, for Generation Partnership Project, or WLAN, Wireless Local Area Network Protocol). In other words, the current characteristic transmit frequency may be a frequency representing the currently used frequency range or channel for transmitting the transmit signal. The current characteristic transmit frequency may vary over time according to a change of a transmit band, resource blocks or a channel use for transmitting the transmit signal, for example.

As already mentioned, the current characteristic transmit frequency may be defined different for different wireless communication protocols. For example, for LTE (e.g. LTE20) the current characteristic transmit frequency may depend on a transmit band currently used for transmitting the transmit signal, a number of resource blocks currently used for transmitting the transmit signal and a current position of the used resource blocks within the used transmit band, for example. For example the current characteristic transmit frequency may be a center frequency of a currently used transmit band for transmitting the transmit signal (e.g. for 3GPP) or a center frequency of resource blocks currently used for transmitting the transmit signal (e.g. LTE).

For example, in other words, for 3G a transmit frequency (current characteristic transmit frequency) may be equal or represented by a center frequency of the allocated RF band width. For LTE, a center frequency of the allocated resource blocks may represent the transmit frequency (current characteristic transmit frequency), for example.

For example, a delay correction may be added, which depends on the number of allocated resource blocks in an LTE system. As described, the delay might even change within the modulation bandwidth. To capture this effect it may be beneficial for ACLR performance to add another delay offset, which may be the averaged delay across the modulation bandwidth, for example. The additional delay offset may be considered for the determination of the current characteristic transmit frequency, for example. Alternatively, the delay control module 140 may consider the number of allocated resource blocks for the determination of the delay control parameter additionally to the current characteristic transmit frequency, for example.

The delay control module 140 may comprise a memory module storing a plurality of values of the at least one delay control parameter associated to a plurality of different characteristic transmit frequencies. In other words, the delay control module 140 may store a Look Up Table comprising different values of the delay control parameter for different characteristic transmit frequencies, which may be used for transmitting the transmit signal.

The different values of the delay control parameter may be determined during a calibration procedure or may be reused or duplicated from a reference device, for example. For example, during a calibration procedure, the optimum ET delay or an ET delay close to the optimum may be measured across the transmit band (or across several transmit bands) in small frequency steps (e.g. every one megahertz, every ten megahertz, every 500 kilohertz or less). The delay optimization may use a calibration procedure (e.g. during manufacturing), which may be implemented in a transmitter or transceiver firmware (FW). As a result, a good or optimum delay across frequency for each supported (e.g. LTE) bandwidth (e.g. optimum delay may depend on LTE bandwidth respective number of allocated resource blocks). An appropriate approximation of the delay response across the transmit band may be found.

Figure 2:
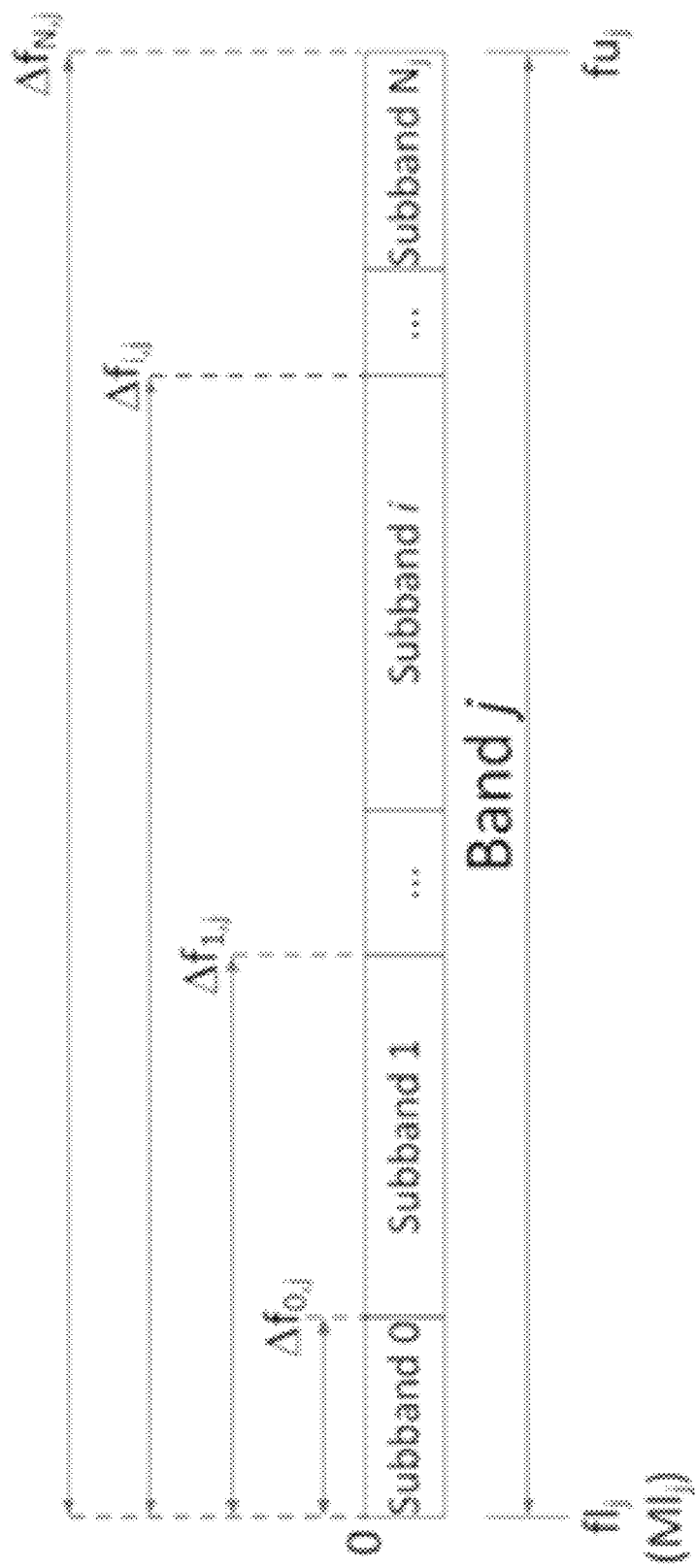
FIG. 2 is a schematic illustration of a partitioning of a transmit band.

For example, a band j with lower frequency boundary $fl_j$ (absolute radio frequency channel number ARFCN value MID may be divided into N+1 sub-bands. The number of sub-bands N+1, the lower frequency bandwidth as well as the (e.g. arbitrarily located) upper sub-band boundaries $\Delta f_{i,j}$ may be stored in tables (e.g. Look Up Table of delay control module). This is one example, although of course other ways of setting the sub-bands and how they may be stored are possible. For instance, the band may be divided into sub-bands of substantially equal width (e.g. +−10% of a reference width), so $$\Delta f_{i,j}=(i+1)\cdot 3\text{GPPBandwidth}/(N+1)$$

as addition in FIG. 2, which may make the $\Delta f_{i,j}$ table obsolete in order to save memory, for example.

In each sub-band of band j at the center frequency $f_{i,j}$ a delay calibration may be executed. The center frequencies may be calculated according to $$F_{i,j} = fl_j + \frac{\Delta f_{i-1,j} + \Delta f_{i,j}}{2} \quad (10)$$

In other words, the memory module of the delay control module 140 may store values of the delay control parameters associated with characteristic transmit frequencies at least apart representing substantially upper frequencies, lower frequencies and/or center frequencies of sub-bands dividing a possible transmit band with substantially equal width (e.g. less than 10% deviation from a reference width) or with predefined (unequal or arbitrary) partitioning, for example.

For example, the duplexer S11 coefficient may vary strongly at the band edges. Therefore, several small sub bands (e.g. smaller than one, some or all band in the center of the band) may be introduced in order to obtain a good representation of the duplexer edge. In other words, the borders of the sub bands may correspond or may be distributed corresponding to a duplexer characteristic), for example.

The signal center frequency f (current characteristic transmit frequency) may be another frequency than the signal frequency defined by the ARFCN value, for example. In case for an LTE signal, the center frequency may depend on the location of the Resource Blocks (RB), for example. The signal center frequency f may be adjusted according to its spectral content, so the spectrum may be located symmetrically around f, for example.

For example, the delay correction may be done based on the center frequency of the resource block cluster and the cluster size which may be given by the number of resource blocks.

Figure 3:
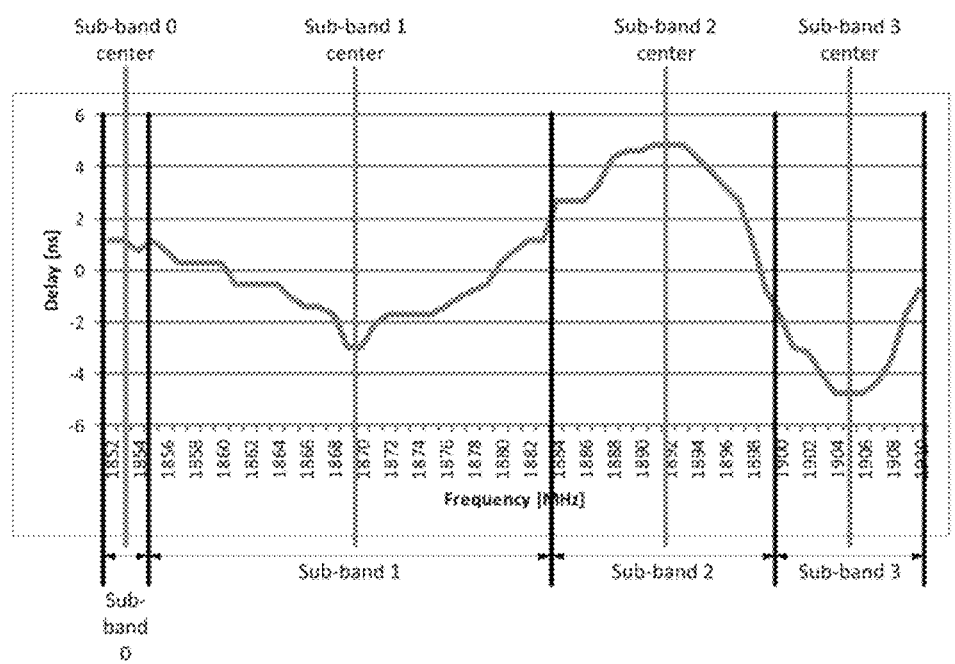
FIG. 3 is a schematic illustration of another partitioning of a transmit band.

In an example, the segmentation into sub-bands may depend on the optimum delay across the transmit band, for example. Thus bandwidth and center frequency of each sub-band may differ from band to band. For example, 3GPP band 1 may have a different segmentation to 3GPP band 2 since the duplexer characteristic may be different and may introduce a different S11 group delay, for example. The segmentation may be such selected that the ACLR performance may be optimum across the transmit band. As an example, the measured delay of a band 2 duplexer and the corresponding optimum division into sub-bands is shown in FIG. 3.

In this example, the sub-band centers are placed at the delay extremes. At these points $F_{i,j}$ delay calibration may take place. For transmission frequencies $f=F_{i,j}$ ACLR may be best, because instantaneous frequencies $f\pm\Delta f$ located left and right of the center of the transmission signal may be delay approximately equally, for example.

In other words, the memory module of the delay control module 140 may store values of the delay control parameter associated with characteristic transmit frequencies at least a part representing substantially extreme values (less than 10% deviation from a position or value of an extreme value) of a frequency-depending group delay caused by at least one component coupled to an output of the power amplifier module, for example.

Figure 4:
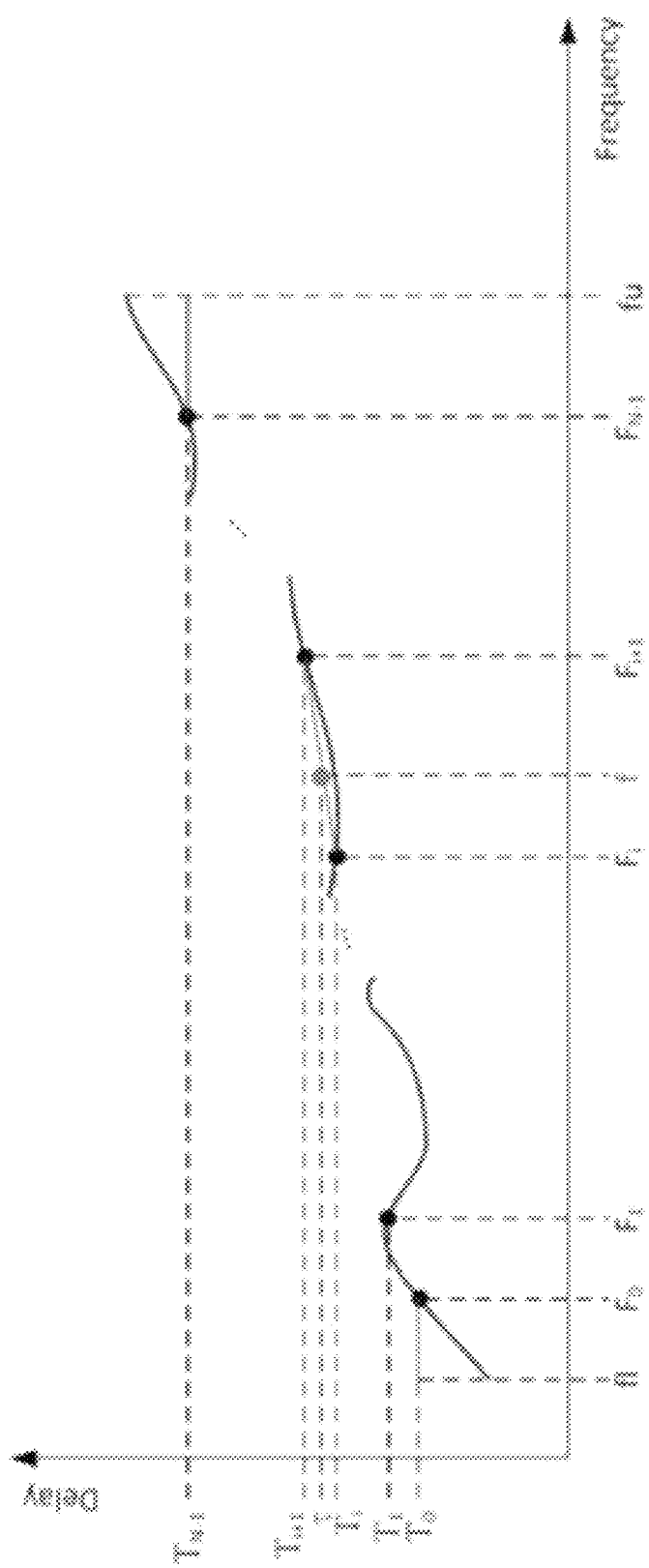
FIG. 4 is a schematic illustration of the interpolation of delay values over subbands.

This may mean that for transmit operation the delay may be well adjusted, if the signal center frequency f (current characteristic transmit frequency) is located exactly at the sub-band center frequency $F_{i,j}$. For signal center frequencies $f\neq F_{i,j}$, it may be interpolated linearly between the center frequencies of the adjacent sub-bands in order to get a good or optimum delay for this dedicated signal frequency (current characteristic transmit frequency). An example is shown in FIG. 4, where the band index j has been omitted for simplicity, and equation 11.

$$\tau(f) = T_i + \frac{T_{i+1} - T_i}{F_{i+1} - F_i}(f - F_i) \quad (11)$$

Two exceptions may occur at the lower and upper band edges, where the delay may be kept constant due to the lack of further calibration points, for example. The interpolation is not restricted to linear interpolation, for example. Other ways of interpolation may also be possible (e.g. spline interpolation or others). Additionally, extrapolation at band edges may be applied to overcome the restriction to constant delays there, for example.

In other words, the delay control module 140 may determine and provide an interpolated value of the delay control parameter based on an interpolation of two stored values associated with the two characteristic transmit frequencies closest to the current characteristic transmit frequency, for example.

Alternatively, the delay control module 140 may provide a value of the delay control parameter associated with the characteristic transmit frequency closest to the current characteristic transmit frequency. In other words, the delay control module 140 may provide a value stored for a characteristic transmit frequency closest to the current characteristic transmit frequency. In this way, a value of the delay control parameter may be provided to the variable delay module 130 that matches an optimum value for the current characteristic transmit frequency better than other values stored by delay control module 140, for example.

Additionally the apparatus 100 may comprise an envelope tracking module within the envelope tracking path 112. The envelope tracking module may determine a transmit signal envelope information based on a baseband transmit signal corresponding to the transmit signal to be amplified by the power amplifier module 110. In other words, the transmit signal to be amplified by the power amplifier module 110 may be derived from a baseband transmit signal. This baseband transmit signal may be provided to the envelope tracking path 112 and to the transmit path 114 (e.g. by a base band processor).

For example, a signal conversion module may be arranged within the transmit path 114. This signal conversion module (e.g. comprising a mixer for an up-conversion of the baseband transmit signal to the transmit band) may generate the transmit signal to be amplified by the power amplifier module 110 based on a baseband transmit signal, for example.

The envelope tracking module may derive a transmit signal envelope information from the baseband transmit signal as described in connection with FIG. 14, for example. For example, the envelope tracking module may comprise a coordinate transformation module, a variable gain module and/or a Look Up Table as mentioned in connection with FIG. 14.

The variable delay module 130 may be located within the envelope tracking path 114 before, after or within the envelope tracking module. For example, the variable delay block 130 may be arranged before a coordinate transformation module, between a coordinate transformation module and a variable gain module, between a variable gain module and a Look Up Table or between the Look Up Table and the power supply module 120. The power supply module may vary the power supply of the power amplifier module 110 based on the transmit signal envelope information (and the delay control parameter).

For example, the variable delay module 130 may vary a delay of the baseband transmit signal (e.g. inphase-quadrature phase-signal), a signal derived from the baseband transmit signal (e.g. polar modulated signal) for determining the transmit signal envelope information or the transmit signal envelope information.

The transmit signal envelope information may be a current amplitude or proportional to a current amplitude of the transmit signal or a control parameter of the power supply module 120 proportional to a power supply voltage required or desired for amplifying the current transmit signal, for example.

The power supply module 120 may comprise a Direct Current (DC)-Direct Current (DC)-converter module (or also called envelope tracking modulator as shown in FIG. 14) to provide a varying supply voltage (or varying supply current) to the power amplifier module 110. In other words, the power supply module 120 may comprise a voltage converter configured to convert an available substantially constant supply voltage (e.g. chip supply voltage) to a currently desired supply voltage to provide a variable voltage to the power amplifier module 110 (e.g. depending on the delay control parameter and the transmit signal envelope information).

As mentioned, the power amplifier module 110 may be connected or coupled to an antenna module 102. The antenna module 102 may comprise at least a duplexer module. For example, the duplexer module may cause a stronger (e.g. in terms of a ratio delay variation to frequency variation) frequency dependency of the delay between the transmit path 114 and the envelope tracking path 112 than one or more other modules coupled to an output of the power amplifier module 110. In other words, the duplexer module may cause the main portion of a frequency dependency of the delay between the transmit path 114 and the envelope tracking path 112. For example, the duplexer module may cause a stronger (e.g. in terms of a ratio delay variation to frequency variation) frequency dependency of the delay between the transmit path 114 and the envelope tracking path 112 and the varying antenna load. The antenna load may vary due to changing environmental condition (e.g. a hand or body in the proximity of a mobile device using a proposed apparatus).

Figure 5:
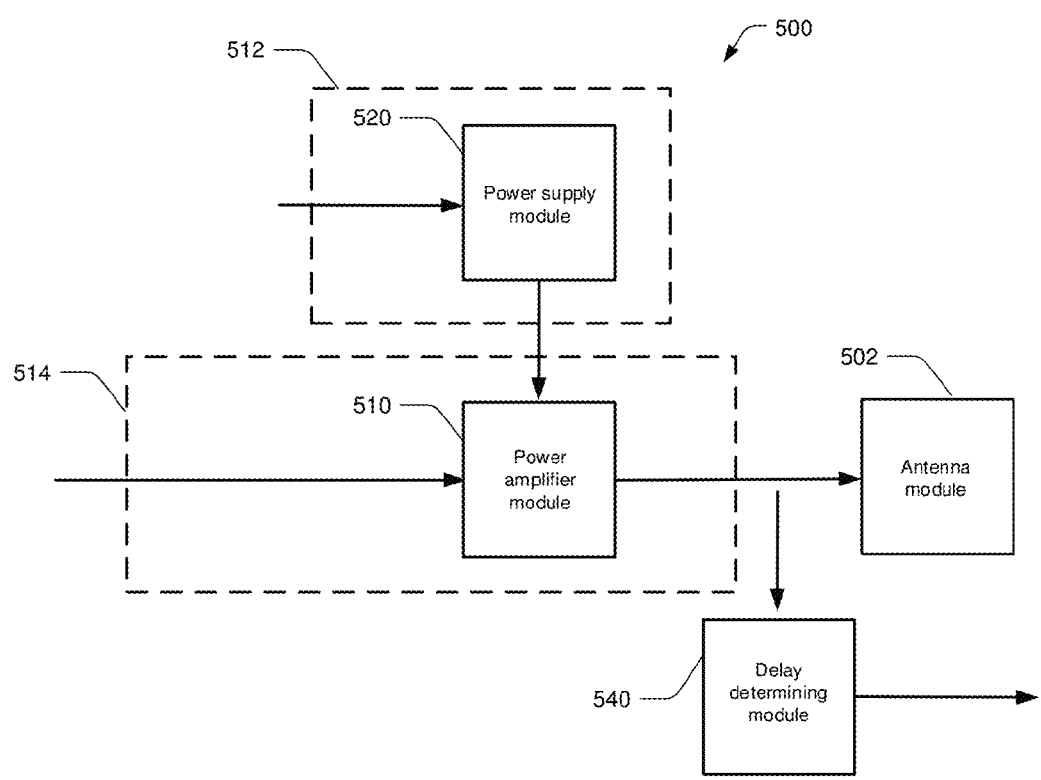
FIG. 5 is a block diagram of an apparatus for determining delay control parameters.

FIG. 5 shows a block diagram of an apparatus 500 for determining values of a delay control parameter according to an example. The apparatus comprises a transmit path 514 with a power amplifier module 510 and an envelope tracking path 512 with the power supply module 520. The power amplifier module 510 can be coupled to an antenna module 502 and amplifies a transmit signal. The power supply module 520 is connected or coupled to the power amplifier module 110 and varies a power supply of the power amplifier module 510. Further, the apparatus 500 comprises a delay-determining module 540. The delay-determining module 540 determines a plurality of values of a delay control parameter corresponding to different signal delays between the transmit path 514 and the envelope tracking path 512 for different characteristic transmit frequencies.

By determining different values of a delay control parameter for different characteristic transmit frequencies, the delay control parameter can be used for implementing a variable signal delay within the envelope tracking path 512 to improve a time alignment between a transmit path 514 and the envelope tracking path 512, for example.

More details and aspects (e.g. regarding transmit path, envelope tracking path, power amplifier module, antenna module, transmit signal, power supply module, delay control parameter and/or characteristic transmit frequency) are described in connection with the proposed concept or one or more examples described above (e.g. FIGS. 1-4, 14 and 15).

The delay-determining module 540 may be a module implemented within a transmitter or transceiver comprising the transmit path 514 and the envelope tracking path 512 or may be part of a test circuit connectable to a transmitter or transceiver comprising the transmit path 514 and the envelope tracking path 512, for example.

During the determination of the values of the delay control parameter, a transmit signal with a pre-defined frequency sequence may be provided to the power amplifier module 110. For example, the apparatus 500 may comprise a signal provider providing a transmit signal with varying characteristic transmit frequency (e.g. as described in connection with FIG. 2-4) to the power amplifier module 110. The signal provider may be part or may be implemented by a baseband processor of the apparatus 500 or may be part of test circuit connected to the apparatus 500, for example.

The delay determining module 540 may determine values of the delay control parameter for characteristic transmit frequencies at least a part representing upper frequencies, lower frequencies or center frequencies of sub-bands dividing possible transmit bands with equal width (e.g. as mentioned in connection with FIG. 2-4). Alternatively or additionally, the delay determining module 540 determines delay control parameter for characteristic transmit frequencies at least a part representing substantially extreme values of a frequency depending group delay caused by components coupled to an output of the power amplifier module 510 (e.g. as mentioned in connection with FIG. 2-4).

The envelope tracking path 512 may comprise a variable delay module varying a signal delay within the envelope tracking path 512 according to the delay control parameter. Further, the power supply module 520 may vary a power supply of the power amplifier module 510 with a temporal alignment adjusted by the variable delay module. Further, the apparatus 500 may comprise a delay control module providing the delay control parameter based on a current characteristic transmit frequency of the transmit signal to the power amplifier module 510 (e.g. as described in connection with FIG. 1-4).

The apparatus 500 may comprise one or more optional, additional features corresponding to one or more aspects mentioned in connection with the proposed concept or one or more examples mentioned above (e.g. FIGS. 1-4, 14 and 15).

Some examples relate to a correction of dynamic delay in an envelope tracking system or an apparatus and a method for determining delay parameters to control the amplification of a transmit signal. The envelope tracking approach enables a reduction of a current consumption of a power amplifier during transmission. The proposed concept may be implemented in envelope tracking capable transceivers. The proposed concept may be embodied in products with high volume architecture (e.g. transceiver, transmitter) or other than high volume architecture (e.g. calibration system or test system). The proposed concept encompasses test systems and/or designs/debug tools that may be low volume as well as transmitters and transceivers, for example.

According to an aspect of the proposed concept the delay across frequency may be measured (e.g. using a special test procedure which may be provided by the transceiver firmware) dividing the transmit band into sub-bands determined by delay characteristic over transmit band and interpolation with each sub-band depending on the number and location of allocated resource blocks, for example.

By using the proposed concept an improved ACLR performance in envelope tracking ET mode and/or a better ACLR performance at lower current consumption may be reached, for example.

Figure 6:
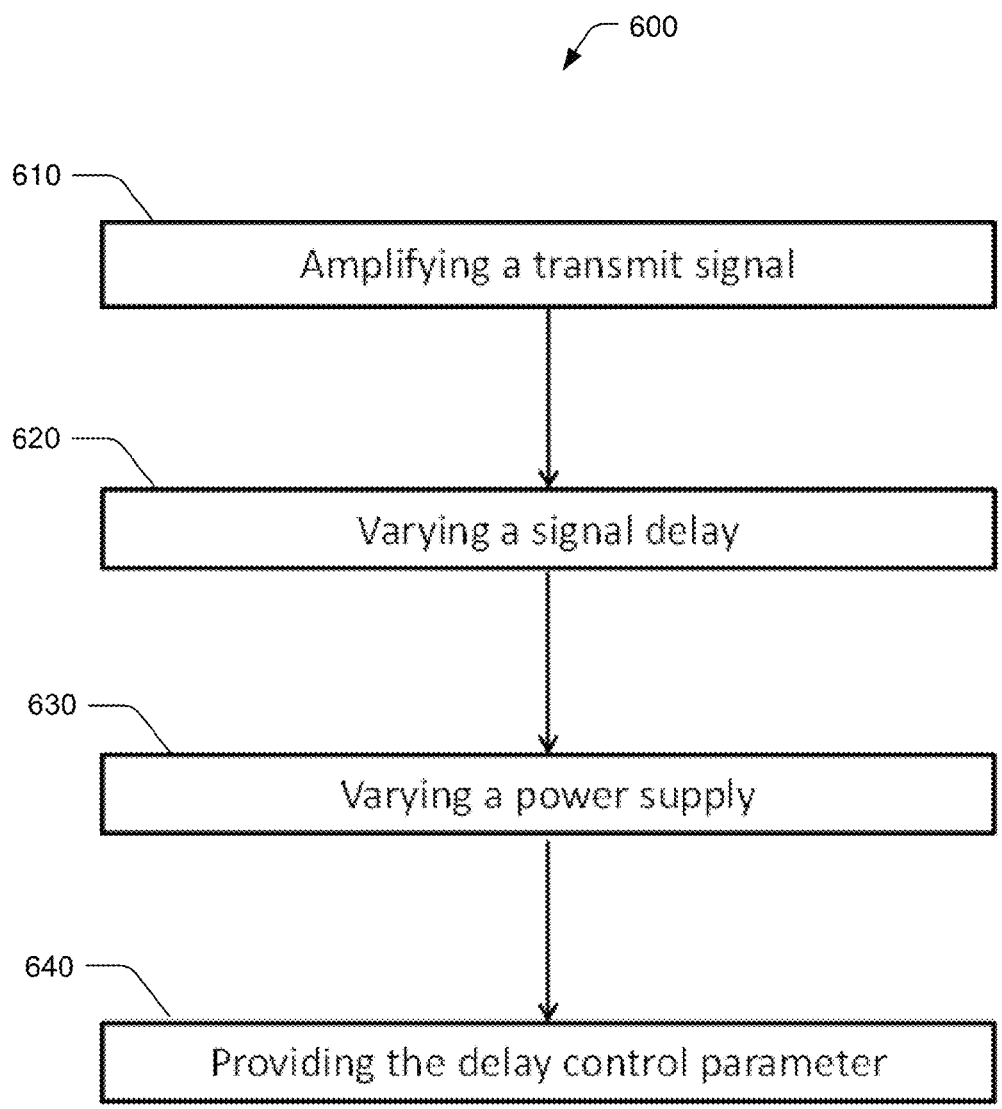
FIG. 6 shows a flow chart of a method for amplifying a transmit signal.

FIG. 6 shows a flow chart of a method 600 for amplifying a transmit signal according to an example. The method 600 comprises amplifying 610 a transmit signal within a transmit path by a power amplifier. Further, the method 600 comprises varying 620 a signal delay within an envelope tracking path according to a delay control parameter and varying 630 a power supply of the power amplifier module with a time alignment adjustable by the varying signal delay. Additionally, the method 600 comprises providing 640 the delay control parameter based on a current characteristic transmit frequency of the transmit signal.

By varying a delay of signals within the envelope tracking path, the synchronization of the variation of the supply voltage of the power amplifier module to a variation of the envelope of the transmit signal (e.g. current amplitude of the transmit signal) can be implemented very accurately. Due to an accurate time alignment of the provided power supply with a desired output amplitude of the power amplifier module distortions of the amplified transmit signal and/or the current consumption may be kept low.

More details and aspects (e.g. regarding the transmit signal, the power amplifier, the signal delay, the analog tracking path, the transmit path, the delay control parameter, the power supply and/or the current characteristic transmit frequency) are mentioned in connection with the proposed concept or one or more examples described above (e.g. FIGS. 1-5, 14 and 15). The method 600 may comprise one or more further optional acts corresponding to one or more aspects mentioned in connection with the proposed concept or one or more examples described above.

Figure 7:
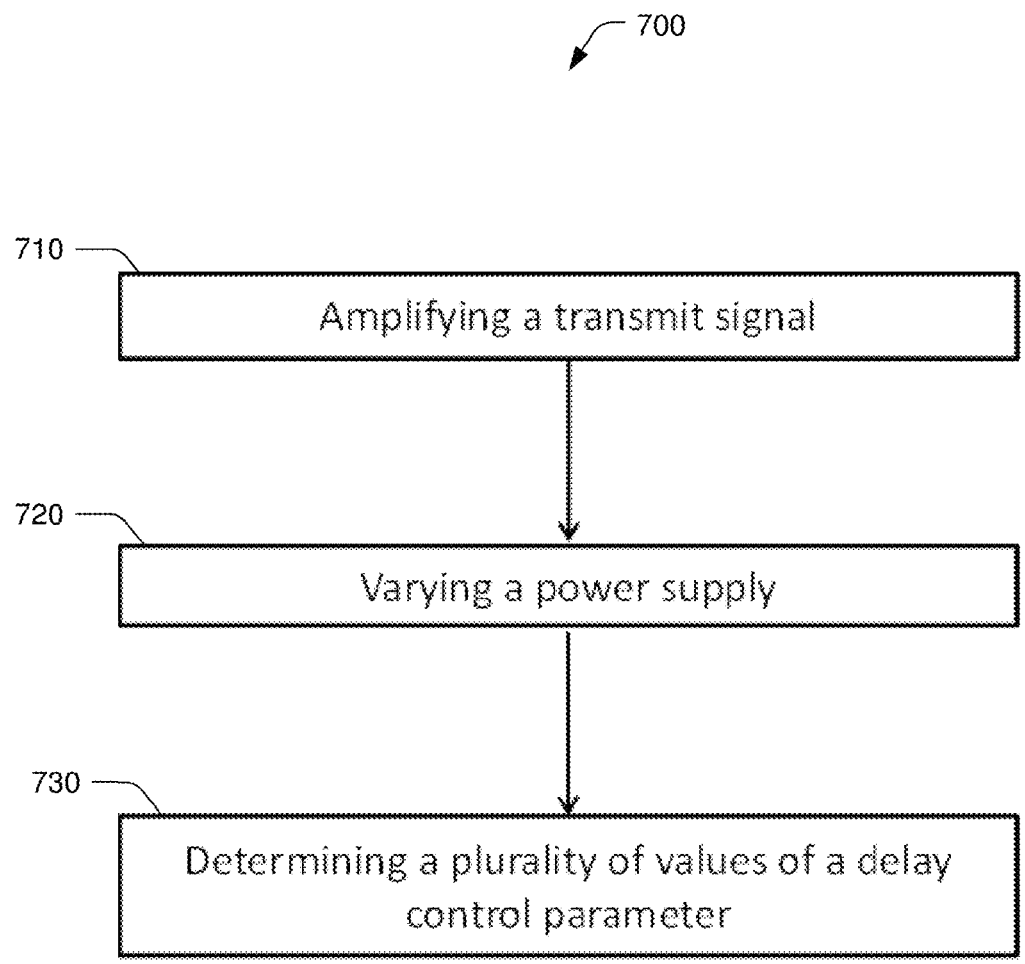
FIG. 7 shows a flow chart of a method for determining delay control parameters.

FIG. 7 shows a flow chart of a method 700 for determining values of a delay control parameter according to an example. The method 700 comprises amplifying 710 a transmit signal within a transmit path by a power amplifier and varying 720 a power supply of the power amplifier through an envelope tracking path. Further, the method 700 comprises determining 730 a plurality of values of a delay control parameter corresponding to different delays between the transmit path and the envelope tracking path for different characteristic transmit frequency.

By determining different values of a delay control parameter for different characteristic transmit frequencies, the delay control parameter can be used for implementing a variable signal delay within the envelope tracking path 512 to improve a temporal alignment between a transmit path 514 and the envelope tracking path 512, for example.

More details and aspects (e.g. regarding the transmit signal, the power amplifier, the signal delay, the analog tracking path, the transmit path, the delay control parameter, the power supply and/or the characteristic transmit frequency) are mentioned in connection with the proposed concept or one or more examples described above (e.g. FIGS. 1-5, 14 and 15). The method 700 may comprise one or more further optional acts corresponding to one or more aspects mentioned in connection with the proposed concept or one or more examples described above.

Figure 8:
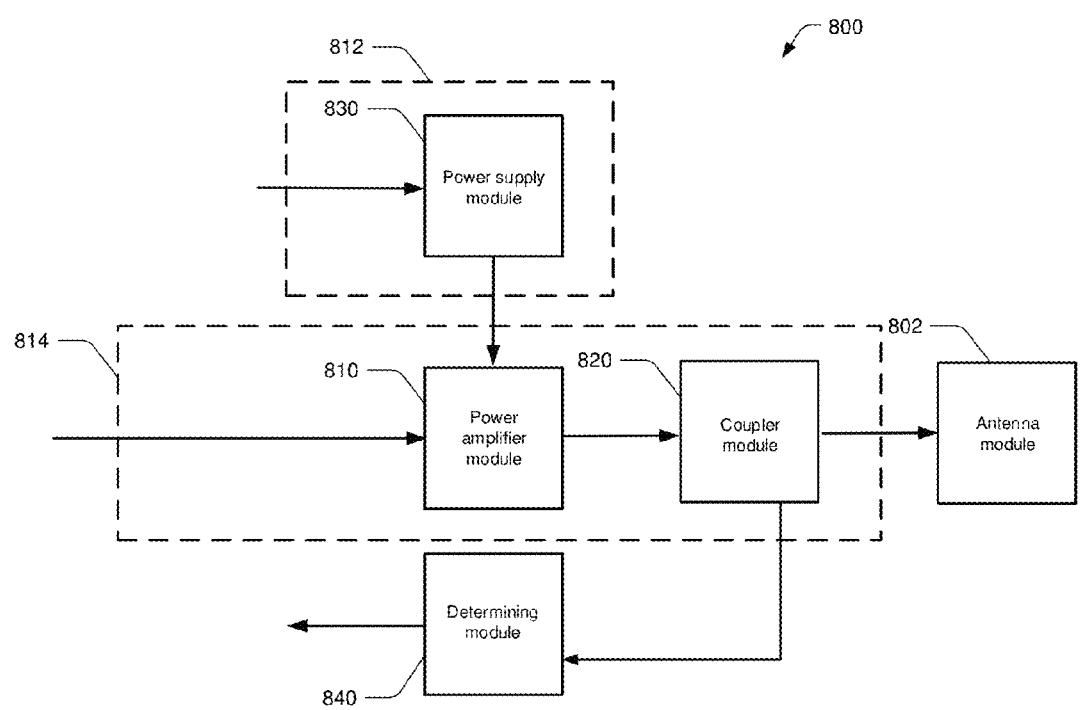
FIG. 8 shows a block diagram of an apparatus for amplifying a transmit signal with a delay-determining module.

FIG. 8 shows a block diagram of an apparatus 800 for amplifying a transmit signal according to an example. The apparatus 800 comprises a power amplifier module 810 arranged within a transmit path 814. The transmit path 814 (and in this way also the power amplifier module) can be coupled to an antenna module 802. The power amplifier module 810 amplifies a transmit signal provided to the power amplifier module 810. Further, the apparatus 800 comprises a coupler module 820 arranged between the power amplifier module 810 and an antenna module 802. The coupling module 820 provides at least a reverse feedback signal. The reverse feedback signal is mainly caused by or derived from a part of the amplified transmit signal reflected by the antenna module 802. Additionally, the apparatus 800 comprises a determining module 840 determining a delay information on a delay between the transmit path 814 and an envelope tracking path 812 based on at least the reverse feedback signal. Further, the apparatus 800 comprises a power supply module 830 arranged within the envelope tracking path 812 varying a power supply of the power amplifier module 810 based on a transmit signal information with a temporal alignment depending on the delay information.

Due to the feedback path, a delay information indicating a varying delay between the transmit path 814 and the envelope tracking path 812 may be determined. Based on the determined delay information, the time alignment of the variation of the power supply of the power amplifier module and a variation within the transmit signal may be improved. In this way, distortion of the transmit signal and/or the power consumption of the signal amplification may be reduced.

More details or aspects regarding the power amplifier module, the transmit path, the envelope tracking path, the antenna module, the transmit signal, the power supply module and/or the transmit signal envelope information are described in connection with the proposed concept or one or more examples mentioned above (e.g. FIGS. 1-5, 14 and 15).

The reverse feedback signal is a signal mainly caused by a part of the amplified transmit signal reflected by the antenna module 802, which may mean that at least 50% (or more than 70%) of an average amplitude or a maximal amplitude of the reverse feedback signal is proportional (or caused) to an amplitude of the reflected wave.

For example, a small part of the forward or reverse wave may be provided being proportional to the forward or reverse wave.

The coupling module 820 may be implemented in various ways. The coupling module 820 may derive at least the reverse feedback signal by a capacitive and/or inductive coupling of a coupling element with a signal line propagating the transmit signal from the power amplifier module to the antenna module 802. For example, the coupling module 820 may comprise a directional coupler. The directional coupler may receive the amplified transmit signal from the power amplifier module 810 at an input port and may provide the amplified transmit signal at an output port to the antenna module 802. A directional coupler may provide a reverse feedback signal at a so-called insulated port. In this way, the reverse feedback signal may be mainly caused by a part of the amplified transmit signal reflected by the antenna module 802, since the reflected wave is received by the directional coupler at the output port.

Optionally the coupling module 820 (e.g. at a so-called coupled port of the directional coupler) may provide also a forward feedback signal mainly caused by the amplified transmit signal propagating from the power amplifier module 810 to the antenna module 8002 (through the coupling module). The forward feedback signal may be provided to the determining module 840 and the determining module 840 may optionally determine the delay information based on the forward feedback signal and the reverse feedback signal.

A reflection of a part of the amplified transmit signal at the antenna module 802 may be caused by one or more components (e.g. duplexer and/or antenna switch) and/or varying environmental conditions in the proximity of one or more antennas of the antenna module 802, for example.

The delay information may be a value or a signal indicating a signal delay (e.g. absolute value) or a change of a signal delay (e.g. relative value) between a signal delay of the transmit path 814 and the signal delay of the envelope tracking path 812. Such information may be based on the reverse feedback signal, since the reverse feedback signal contains information on an influence of the components of the antenna module 802 and/or of environmental conditions in the proximity of the antenna module 802 to the signal delay.

The determining module 840 may determine the delay information based on at least the reverse feedback signal in various ways. For example, the determining module 840 may determine a reflection coefficient of the antenna module based on a forward feedback signal and the reverse feedback signal in order to determine the delay information based on the reflection coefficient. Optionally the determining module 840 may further determine an absolute value and phase of the reflection coefficient and of the antenna module 802 to determine the delay information, for example. Further, the determining module 840 may determine a frequency depending group delay based on the absolute value and the phase of the reflection coefficient of the antenna module 802, for example. A detailed example of the determination of a frequency-depending group delay is described in connection with FIG. 9, for example.

The delay information may vary in dependency on a frequency of the transmit signal. The frequency of the transmit signal may be defined in various ways (e.g. characteristic transmit frequency described above) and may depend on a selected channel, transmit band, resource blocks and/or wireless communication protocol used for transmitting the transmit signal, for example. The delay information may be represented by a frequency-depending group delay caused by the antenna module 802 (e.g. the frequency dependency may be caused by the antenna module).

Further, the apparatus 800 may comprise an envelope tracking module arranged within the envelope tracking path 812 determining the transmit signal envelope information based on a baseband transmit signal corresponding to the transmit signal. For example, the transmit signal envelope information may be based on a current amplitude of the transmit signal or a current amplitude of the baseband transmit signal. More aspects regarding the envelope tracking module and the baseband transmit signal are mentioned in connection with the examples described above (e.g. FIGS. 1 and 14).

The envelope tracking module may comprise a variable delay module as mentioned in connection with one or more examples described above (e.g. FIGS. 1 and 14). The variable delay module may vary a signal delay within the envelope tracking path 812 based on the delay information to adjust the time alignment of a variation of the power supply of the power amplifier module 810 to a corresponding variation of the transmit signal. The variable delay module may be implemented at different locations within the envelope tracking module. For example, the variable delay module may vary a delay of the baseband transmit signal, a signal derived from the baseband transmit signal for determining the transmit signal envelope information or the transmit signal envelope information as also mentioned above (e.g. FIGS. 1 and 14).

The power supply module 820 may be implemented in various ways. For example, the power supply module may comprise a DCDC converter module providing a variable supply voltage (or supply current) to the power amplifier module 810.

The antenna module 802 may comprise various components. For example, the antenna module 802 may comprise a duplexer module. The duplexer module may cause a stronger (e.g. in terms of a ratio delay variation to frequency variation) frequency dependency of the delay between the transmit path 814 and the envelope tracking path 812 than other modules coupled to an output of the power amplifier module 810. Further, the duplexer module may cause a stronger (e.g. in terms of a ratio delay variation to frequency variation) frequency dependency of the delay between the transmit path and the envelope tracking path 814 than a varying antenna load as already mentioned above.

Optionally, the apparatus 800 may comprise a signal conversion module within the transmit path 814 generating the transmit signal to be provided to the power amplifier based on a baseband transmit signal (e.g. as also described in connection with FIGS. 1 and 14).

The coupler module 820 may provide a high frequency reverse feedback signal comprising substantially the same or similar frequency range as the transmit signal. The determining module 840 may use this high frequency reverse feedback signal to determine the delay information or the high frequency reverse feedback signal may be down-converted before the determining module 840 may determine the delay information based on a resulting baseband reverse feedback signal, for example. In other words, the apparatus 800 may comprise a feedback signal conversion module generating a baseband reverse feedback signal (and optionally also a baseband forward feedback signal) based on the reverse feedback signal (the optional baseband forward feedback signal based on the forward feedback signal) provided by the coupler module 820. For example, the feedback signal conversion module may comprise a mixer for down-converting the high frequency reverse feedback signal provided by the coupler module 820 (from the RF domain) to the baseband reverse feedback signal (to the base band domain) to be provided to the determining module 840. The determining module may determine the delay information based on the baseband forward feedback signal and the baseband reverse feedback signal.

The apparatus 800 (e.g. a variable delay module of the apparatus) may vary a signal delay within the envelope tracking path 812 based on the delay information during transmission of the transmit signal. In other words, a variable signal delay within the envelope tracking path 814 may be applied during normal operation of a transmitter or transceiver using a proposed apparatus, for example (as also mentioned in connection with FIG. 1).

Figure 9:
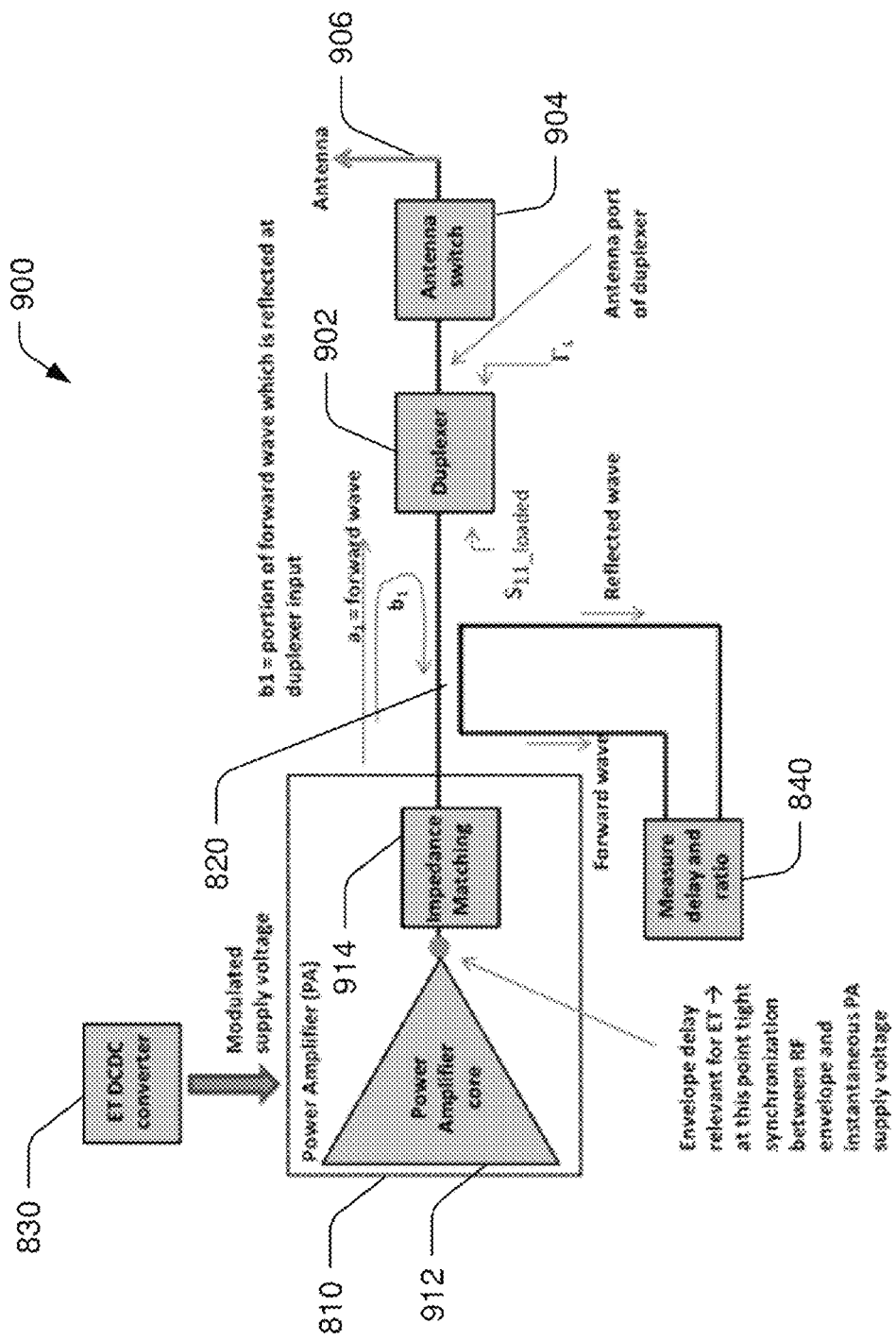
FIG. 9 shows a block diagram of an apparatus for amplifying a transmit signal indicating forward and reflected waves.

FIG. 9 shows a block diagram of an apparatus for amplifying a transmit signal according to an example. The implementation of the apparatus 900 is similar to the apparatus shown in FIG. 8. The power amplifier module 810 comprises a power amplifier core 912 and an impedance matching circuit 914. An output of the power amplifier core 912 is connected to an input of the impedance matching circuit 914. A power supply module 830 (e.g. comprising envelope tracking ET DCDC converter) is connected to the power amplifier module 810 and provides a modulated supply voltage to the power amplifier module 810. An output of the power amplifier module 810 is connected to an input of a coupling module 820. An output of the coupling module 820 is connected to an antenna module comprising a duplexer 902, an antenna switch 904 and at least one antenna 906. The coupling module 820 provides a forward feedback signal (forward wave) and a reverse feedback signal (reflected wave) to a determining module 840. The determining module 840 may measure a delay and/or ratio, for example. An output port of the coupler module 820 is connected to an input of the duplexer 902 and an antenna port of the duplexer is connected to an antenna switch 904. The envelope delay (delay within the envelope tracking path) is relevant for the envelope tracking ET. At the point between the power amplifier core 912 and the impedance matching circuit 914 a tight synchronization between radio frequency RF envelope (envelope of transmit signal) and instantaneous power amplifier PA supply voltage may be desired.

For example, the power amplifier 810 generates a forward wave $a_1$. A portion of the forward wave is reflected at the duplexer input. The reflected wave may be called $b_1$. The envelope of the reflected wave may be delayed at the duplexer input. This delay may be caused by $S_{11}$ group delay, referring to a group delay which can be caused by a reflection at the input of the duplexer. A group delay may always occur if the radio frequency RF phase rapidly changes over frequency. The group delay is approximately $\Delta$(phase)/$\Delta$(frequency).

The $S_{11}$ group delay (which may be normally of low interest in an RF system) may influence the envelope tracking ET delay between the RF envelope (envelope or amplitude of transmit signal) and instantaneous power amplifier (PA) supply voltage causing performance degradation in an envelope tracking ET system, for example.

The RF output voltage at the duplexer input may be $$(a_1+b_1)*\sqrt{Z_0}$$

a superposition of forward and reflected wave with $Z_0$ indicating a reference impedance. $a_1$ and $b_1$ may be complex numbers described by its magnitude and phase, for example.

In a real application, the duplexer may be terminated by a non 50Ω impedance at its antenna port (a duplexer may have a transmit TX port where the power amplifier PA is connected, a receive RX port connected to a Low Noise amplifier LNA and an antenna port which combines the RX and TX signal). Then $S_{11\_loaded}$ may represent the reflection coefficient with a non 50Ω impedance at the antenna port of the duplexer. From S-parameter theory, the following may be valid:

$$S_{11\_loaded}=s_{11}+s_{12}*s_{21}*\Gamma_L/(1-s_{22}*\Gamma_L)$$

With $s_{i,j}$ indicating S-parameters of the duplexer and $\Gamma_L$ indicating a load connected at the duplexer antenna port.

Since the envelope of the reflected wave is delayed due to $S_{11\_loaded}$ group delays the RF voltage $(a_1+b_1)*\sqrt{Z_0}$ given by superposition (sum) of forward and reflected wave may be also delayed, for example. The delay of the envelope of the sum voltage may depend on the group delay introduced by $S_{11\_loaded}$. The exact equation describing the delay of the sum of a forward and reflected wave may be more complicated.

An example of a formula of the reflection group delay was described in connection with FIG. 14, for example. The reflection group delay is a new parameter describing the delay of an envelope of a signal generated by superposition of a forward and delayed reflected wave, for example. The reflection group delay may be a figure of merit in each envelope tracking ET system, for example.

$$\tau_{gr}=\tau_{Duplexer}\frac{r(\cos\varphi+r)}{(1+r^2+2r\cos\varphi)}-\frac{1}{2\pi}\frac{\frac{dr}{df}\sin\varphi}{(1+r^2+2r\cos\varphi)}$$

with $r = mag(s_{11\_loaded})$ $\varphi = \text{phase}(s_{11\_loaded})$ $$\tau_{Duplexer}=-\frac{1}{2\pi}\frac{d\varphi}{df}$$

The reflection group delay $T_{gr}$ according to the equation above may be different from the transfer group delay associated with the transfer characteristic of a duplexer ($S_{21}$ group delay).

The reflection group delay $T_{gr}$ may be caused by superposition of forward and reflected wave. Differences to the transfer group delay (which may be fully characterized by $S_{21}$ phase change over frequency) may be that the duplexer group delay $T_{duplexer}$ may be caused by a phase change of $S_{11\_loaded}$ over frequency. Further, the reflection group delay may depend on the absolute phase $\phi$. The phase $\phi$ may determine the static phase shift between forward and reflected wave. Depending on the phase shift $\phi$ the duplexer group delay $T_{duplexer}$ may change the reflection group delay $T_{gr}$. This may be different from the transfer group delay which does not depend on an absolute phase shift, for example. Further, the reflection group delay may also depend on how fast the magnitude of $S_{11\_loaded}$ changes over frequency (dr/df). Consequently, a reflection group delay may occur if the magnitude of $S_{11\_loaded}$ changes over frequency. This is different from the transfer group delay, which may be fully described by the phase change over frequency, for example.

The equation above may teach why a duplexer may be a critical element in an envelope tracking ET system, for example. Due to multiple resonances in the transmit filter, each duplexer may heavily change phase and magnitude of $S_{11\_loaded}$ within the transmit band.

The reflection group delay $T_{gr}$ may cause a shift of the RF envelope which may degrade the time synchronization (e.g. optimum ET delay) between the RF envelope and the modulated PA supply voltage provided by the ET modulator (power supply module). Some examples above relate to running a delay calibration in factory and how to compensate the reflection group delay across the transmit band. Also some examples relate to a static envelope tracking ET delay compensation which may be unable to account for ET delay changes which occur during real phone operation (e.g. due to antenna mismatch), for example.

Some examples described above (e.g. in connection with FIGS. 8 and 9) relate to determining and tracking the ET delay during transmit operation. In this way, the ET delay may be improved or optimized when the duplexer characteristic is changed (e.g. due to mismatch at the antenna).

A coupler may be added between the power amplifier output and the duplexer input. The coupler may sample a portion of the forward and a portion of the reflected wave. The delay between forward and reflected wave may be determined (e.g. by analyzing the RF phase difference at distinct frequencies or by running correlation in time domain after down-converting the signal). The ratio of reflected and forward wave may deliver the magnitude of $S_{11\_loaded}$. The duplexer reflection delay may be calculated according to the equation above.

The ET relevant delay may be the delay at the power amplifier output, for example, at the collector before the power amplifier matching network which may map the reference impedance (normally 50Ω) to a desired or optimum PA load, for example. The PA matching may be designed to have a flat phase response over the transmit frequency band (e.g. minor group delay). Therefore, it may be assumed that the PA matching does not add additional delay or only neglectable additional delay. For example, measurements confirm a good correlation between desired or optimum ET delay and reflection group delay $T_{gr}$.

Figure 10:
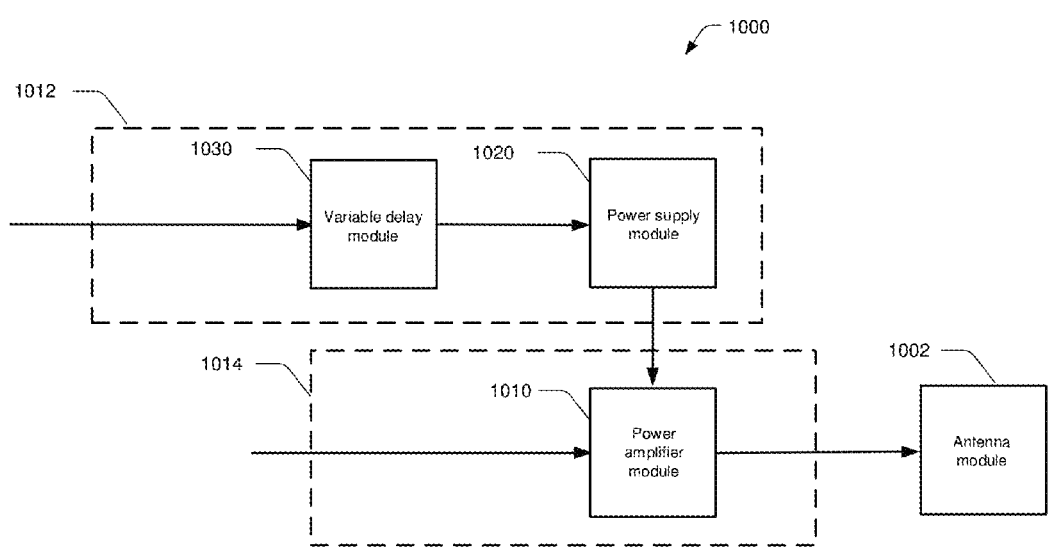
FIG. 10 shows a block diagram of an apparatus for amplifying a transmit signal with a variable delay module.

FIG. 10 shows a block diagram of an apparatus 1000 for amplifying a transmit signal according to an example. The apparatus 1000 comprises a transmit path 1014 and an envelope tracking path 1012. The transmit path 1014 comprises a power amplifier module 1010 to be coupled to an antenna module 1002. The power amplifier module 1010 amplifies a transmit signal. The envelope tracking path 1012 comprises a power supply module 1020. The power supply module 1020 varies a power supply of the power amplifier module 1010 with a temporal alignment adjustable by a variable delay module. The variable delay module 1030 is arranged within the envelope tracking path 1012 (as shown in FIG. 10) or within the transmit path 1014 (alternative example). The variable delay module 1030 varies a signal delay within the envelope tracking path 1012 or the transmit path 1014 according to a transmit signal frequency depending variation of a delay difference between the transmit path 1012 and the envelope tracking path 1014.

By varying a delay of signals within the envelope tracking path, the synchronization of the variation of the supply voltage of the power amplifier module to a variation of the envelope of the transmit signal (e.g. current amplitude of the transmit signal) can be implemented very accurately. Due to an accurate temporal alignment of the provided power supply with a desired output amplitude of the power amplifier module distortions of the amplified transmit signal and/or the current consumption may be kept low.

More details and aspects regarding the transmit signal, the transmit path, the envelope tracking path, the power amplifier module, the antenna module, the variable delay module, the power supply module and/or the transmit signal frequency depending variation are described in connection with the proposed concept or one or more examples described above (e.g. FIGS. 1-9, 14 and 15).

The transmit path 1014 and the envelope tracking path 1012 may comprise a constant delay difference, if the output of the power amplifier module 1010 is connected to a reference impedance (e.g. 50Ω), for example. In normal operation of a transmitter or transceiver using the apparatus 1000, the load at the output of the power amplifier module 1010 may vary. For example, a duplexer of the antenna module 1002 connected to the transmit path 1014 may cause a frequency depending variation of the delay difference between the transmit path 1014 and the envelope tracking path 1012. In order to reduce or compensate such a variation of the delay difference, the variable delay module 1030 may be arranged in the envelope tracking path 1030 or within the transmit path 1014.

The apparatus 1000 may comprise one or more optional, additional features corresponding to one or more aspects mentioned in connection with the proposed concept or one or more examples described above (e.g. FIGS. 1-9, 14 and 15).

For example, the power supply module 1020 may vary the power supply of the power amplifier module 1010 with a temporal alignment adjusted by the variable delay module 1030 during a transmission of the transmit signal to an external receiver. In other words, the power supply module 1020 may vary the power supply of the power amplifier module 1010 during normal operation of a transmitter or transceiver using the apparatus 1000, for example.

The apparatus 1000 may determine a required or desired variable delay to be provided by the variable delay module 1030 dynamically in real time (e.g. as described in connection with FIGS. 8 and 9). For example, the apparatus 1000 may comprise a coupling module arranged between the power amplifier module 1010 and the antenna module 1002 to be coupled to the power amplifier module 1010. The coupling module may provide a forward feedback signal mainly caused by the amplified transmit signal propagating from the power amplifier module 1010 to the antenna module 1002 and a reverse feedback signal mainly caused by a part of the amplified transmit signal reflected by the antenna module 1002. Further, the apparatus 1000 may comprise a determining module determining a delay information on a delay between the transmit path 1014 and an envelope tracking path 1012 based on the forward feedback signal and the reverse feedback signal. The variable delay module 1030 may vary the signal delay of the envelope tracking path 1012 or the transmit path 1014 based on the delay information.

Alternatively, the apparatus 1000 may comprise a memory unit storing different values of a delay control parameter for different characteristic transmit frequencies of the transmit signal (e.g. as described in connection with FIG. 1-5). For example, the variable delay module 1030 may vary a signal delay within the envelope tracking path 1012 or the transmit path 1014 according to a delay control parameter. The apparatus 1000 may comprise a delay control module providing the delay control parameter based on a current characteristic transmit frequency of the transmit signal.

Some examples relate to a measurement of delay in an envelope tracking System. The proposed concept may be implemented in high-volume architectures as for example wireless terminals (e.g. smartphones) or may be embodied in computer system architecture features and interfaces made in high volumes. The proposed concept may encompass Integrated Architecture IA, devices (e.g. transistors) and associate the manufacturing MFG processes, for example.

According to an aspect, the ET delay may be estimated during transmit operation. This may be achieved by adding a coupler between the power amplifier output and duplexer input. The ET delay (time difference between RF envelope and instantaneous power amplifier supply voltage) may correlate with the delay between forward and reflected RF wave which may be caused by the group delay characteristic of the duplexer input impedance and the ratio of magnitude of forward and reflected wave, for example.

The reflection group delay caused by each duplexer may impact the performance of an ET system. The reflection group delay may be a figure of merit introduced by the proposed concept as described above, the reflection group delay may depend on the duplexer characteristic (see equation above). Further, it is described how a good or optimum ET delay may depend on duplexer reflection group delay, for example. Based on this aspect, the forward and reflected wave may be analyzed at the input of the duplexer. The change of the ET delay due to the duplexer may be determined by measuring the delay between forward and reflected wave, the ratio of reflected and forward wave and by inspecting how both figures change over frequency.

According to the proposed concept, an improved or superior ACLR performance in ET mode and/or a better ACLR performance at lower current consumption may be achieved, for example.

Figure 11:
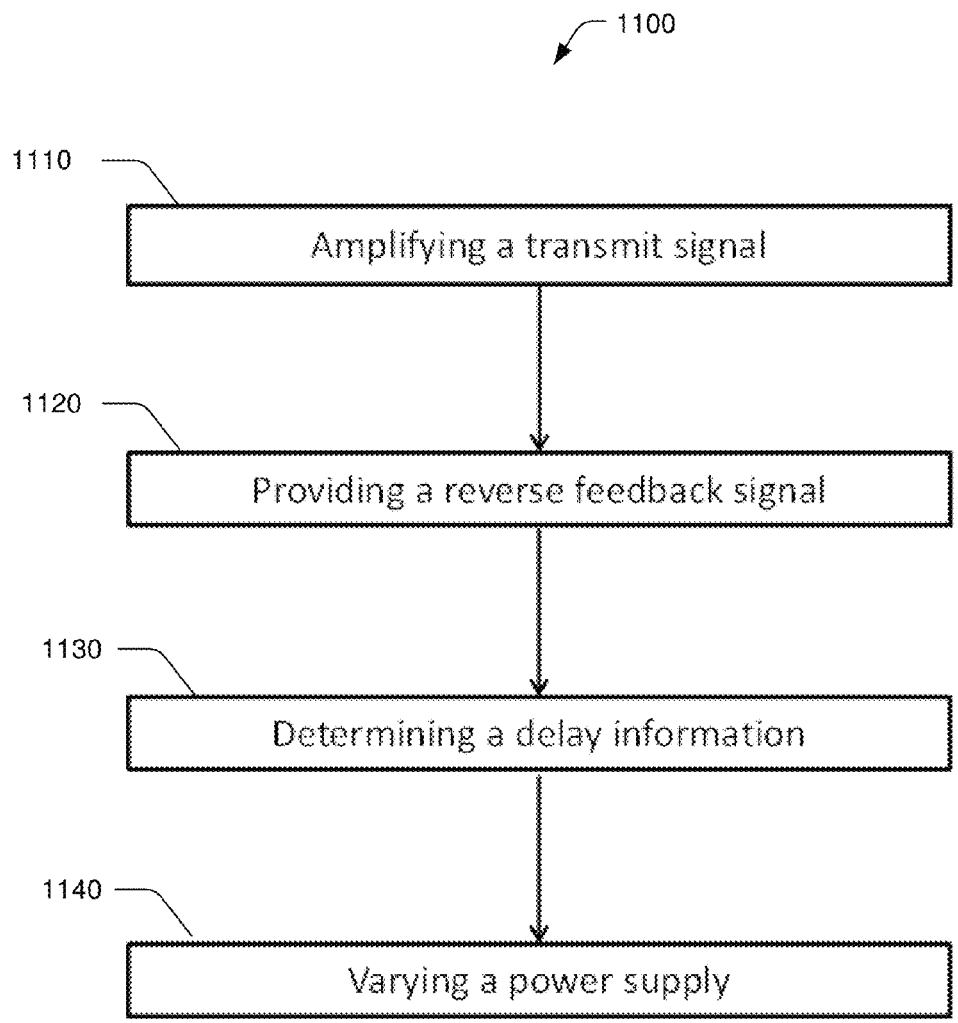
FIG. 11 shows a flow chart of a method for amplifying a transmit signal.

FIG. 11 shows a flow chart of a method 1100 for amplifying a transmit signal according to an example. The method 1100 comprises amplifying 1110 a transmit signal within a transmit path by a power amplifier and providing 1120 a reverse feedback signal mainly caused by a part of the amplified transmit signal reflected by an antenna module coupled to the power amplifier. Further, the method 1100 comprises determining 1130 a delay information on a delay between the transmit path and an envelope tracking path based on at least the reverse feedback signal and varying 1140 a power supply of the power amplifier based on a transmit signal envelope information with the temporal alignments depending on the delay information.

Due to the feedback path, a delay information indicating a varying delay between the transmit path and the envelope tracking path may be determined. Based on the determined delay information, the temporal alignment of the variation of the power supply of the power amplifier module and a variation within the transmit signal may be improved. In this way, distortion of the transmit signal and/or the power consumption of the signal amplification may be reduced.

More details and aspects (e.g. regarding the transmit signal, the power amplifier, the signal delay, the analog tracking path, the transmit path, the delay control parameter, the power supply and/or the current characteristic transmit frequency) are mentioned in connection with the proposed concept or one or more examples described above (e.g. FIGS. 1-5, 14 and 15). The method 1100 may comprise one or more further optional acts corresponding to one or more aspects mentioned in connection with the proposed concept or one or more examples described above.

Figure 12:
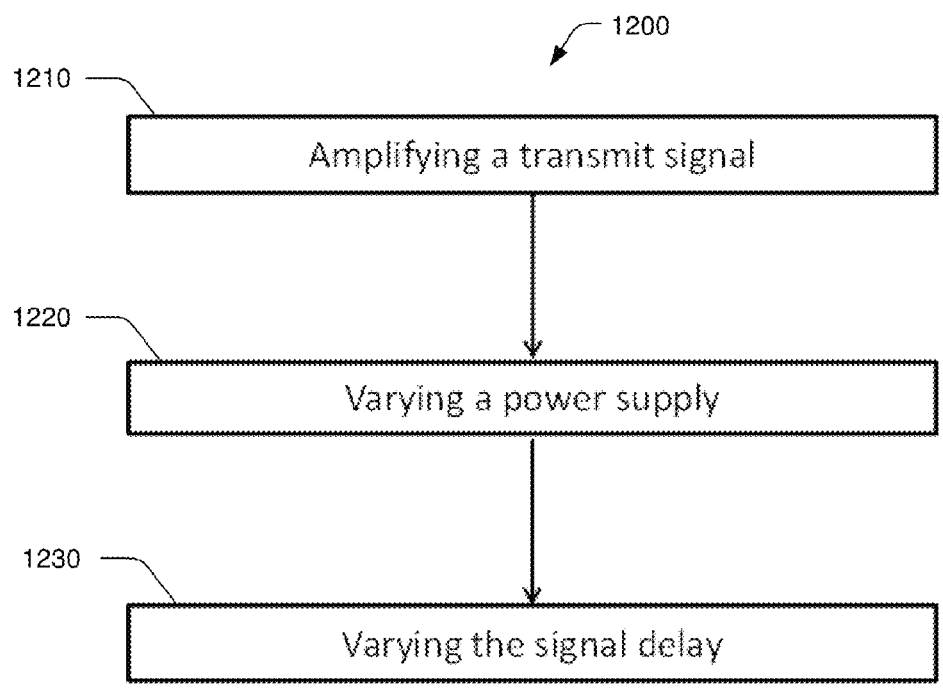
FIG. 12 shows a flow chart of another method for amplifying a transmit signal.

FIG. 12 shows a flow chart of a method 1200 for amplifying a transmit signal according to an example. The method 1200 comprises amplifying 1210 a transmit signal within a transmit path by a power amplifier and varying 1220 a power supply of the power amplifier with a temporal alignment adjustable by a variable signal delay within an envelope tracking path or the transmit path. Further, the method 1200 comprises varying 1230 the signal delay within the envelope tracking path or the transmit path according to a transmit signal frequency depending variation of a delay difference between the transmit path and the envelope tracking path.

Due to the feedback path, a delay information indicating a varying delay between the transmit path and the envelope tracking path may be determined. Based on the determined delay information, the temporal alignment of the variation of the power supply of the power amplifier module and a variation within the transmit signal may be improved. In this way, distortion of the transmit signal and/or the power consumption of the signal amplification may be reduced.

More details and aspects (e.g. regarding the transmit signal, the power amplifier, the signal delay, the analog tracking path, the transmit path, the delay control parameter, the power supply and/or the current characteristic transmit frequency) are mentioned in connection with the proposed concept or one or more examples described above (e.g. FIGS. 1-5, 14 and 15). The method 1200 may comprise one or more further optional acts corresponding to one or more aspects mentioned in connection with the proposed concept or one or more examples described above.

Some examples relate to a transmitter or transceiver comprising an apparatus for amplifying a transmit signal according to the proposed concept or one or more examples described above. For example, a radio frequency (RF) device (e.g. a cell phone, a Base Station or another RF communication device) may comprise such a transmitter or a transceiver. A proposed transmitter or transceiver may be used in mobile communication applications, terrestrial broadcasting applications, satellite communication applications, line-of-sight radio applications or radio remote control applications.

Further examples relate to a mobile device (e.g. a cell phone, a tablet or a laptop) comprising a transmitter or a transceiver described above. The mobile device or mobile terminal may be used for communicating in a mobile communication system.

Figure 13:
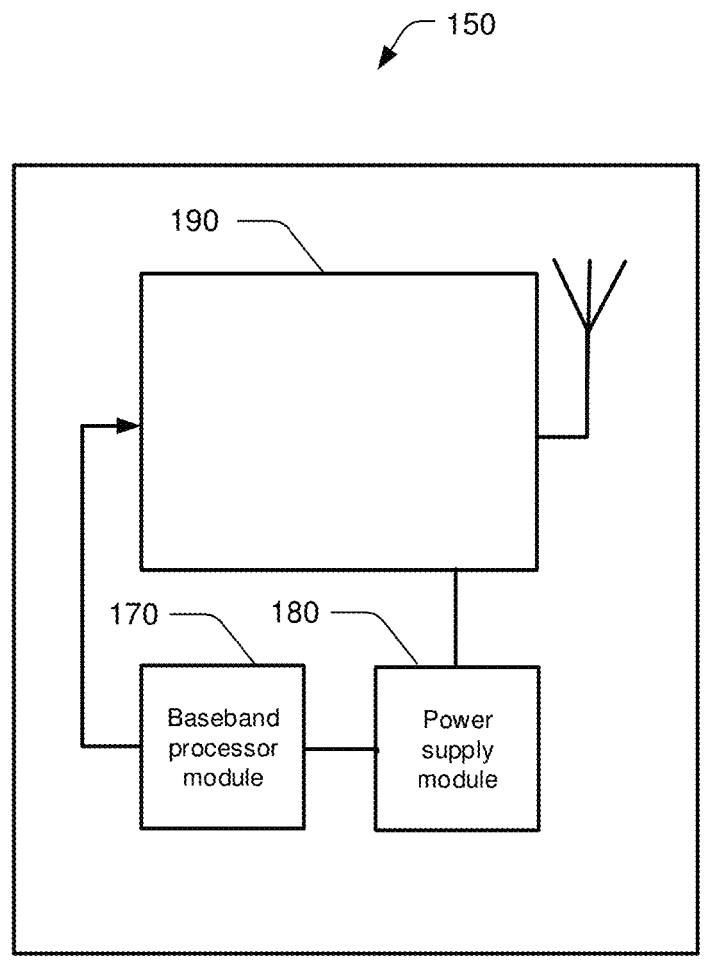
FIG. 13 shows a block diagram of a mobile device.

FIG. 13 shows a schematic illustration of a mobile device 150 according to an example. The mobile device comprises an apparatus 190 for amplifying a transmit signal as described in connection with the proposed concept or one or more examples described above (e.g. FIGS. 1,5,8,9,10 and 14). Further, the mobile device 150 comprises a baseband processor module 170 generating a baseband transmit signal and provides the baseband transmit signal to the apparatus 190. Additionally, the mobile device comprises a power supply unit 180 supplying at least the apparatus 190 and the baseband processor module 170 with power. Further, the mobile device 150 comprises an antenna connected to the apparatus 190 for transmitting the high frequency transmit signal provided by the apparatus 190.

In some examples, a cell phone may comprise a transmitter or a transceiver comprising an apparatus for determining information on an amplitude error of a transmit signal according to the proposed concept or one or more examples described above.

Further, some examples relate to a base station or a relay station of a mobile communication system comprising a transmitter or a transceiver with an apparatus for determining information on an amplitude error of a transmit signal according to the described concept or one or more examples described above.

A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), frequency Division Multiple Access (FDMA), Orthogonal frequency Division Multiple Access (OFDMA), Code Division Multiple Access (CDMA), etc.

In the following examples pertain to further examples. Example 1 is an apparatus for amplifying a transmit signal comprises a transmit path comprising a power amplifier module to be coupled to an antenna module. The power amplifier module is configured to amplify a transmit signal. Further, the apparatus comprises an envelope tracking path comprising a variable delay module and a power supply module. The variable delay module is configured to vary a signal delay within the envelope tracking path according to a delay control parameter. Further, the apparatus comprises a delay control module configured to provide the delay control parameter based on a current characteristic transmit frequency of the transmit signal.

Optionally, the power supply module is configured to vary a power supply of the power amplifier module with a temporal alignment adjustable by the variable delay module.

In example 2, the subject matter of example 1 can optionally include the current characteristic transmit frequency depending on a transmit band currently used for transmitting the transmit signal.

In example 3, the subject matter of one of the previous examples can optionally include the current characteristic transmit frequency depending on a transmit band currently used for transmitting the transmit signal, a number of resource blocks currently used for transmitting the transmit signal and a current position of the used resource blocks within the used transmit band.

In example 4, the subject matter of one of the previous examples can optionally include the current characteristic transmit frequency being a center frequency of a currently used transmit band for transmitting the transmit signal or a center frequency of one or more resource blocks currently used for transmitting the transmit signal.

In example 5, the subject matter of one of the previous examples can optionally include the delay control module comprising a memory module storing a plurality of values of the delay control parameter associated to a plurality of different characteristic transmit frequencies.

In example 6, the subject matter of one of the previous examples can optionally include the delay control module is configured to provide a value of the delay control parameter associated with a characteristic transmit frequency closest to the current characteristic transmit frequency.

In example 7, the subject matter of one of the previous examples can optionally include the delay control module is configured to determine and provide an interpolated value based on an interpolation of two stored values associated with the two characteristic transmit frequencies closest to the current characteristic transmit frequency.

In example 8, the subject matter of one of the previous examples can optionally include the memory module stores values of the delay control parameter associated with characteristic transmit frequencies at least a part representing substantially upper frequencies, lower frequencies or center frequencies of subbands dividing a possible transmit band with substantially equal width.

In example 9, the subject matter of one of the previous examples can optionally include the memory module stores values of the delay control parameter associated with characteristic transmit frequencies at least a part representing substantially extreme values of a frequency depending group delay caused by at least one component coupled to an output of the power amplifier module.

In example 10, the subject matter of one of the previous examples can optionally include an envelope tracking module within the envelope tracking path configured to determine a transmit signal envelope information based on a baseband transmit signal corresponding to the transmit signal, wherein the power supply module is configured to vary the power supply based on the transmit signal envelope information.

In example 11, the subject matter of one of the previous examples can optionally include the variable delay module is configured to vary a delay of the baseband transmit signal, a signal derived from the baseband transmit signal for determining the transmit signal envelope information or the transmit signal envelope information.

In example 12, the subject matter of one of the previous examples can optionally include the transmit signal envelope information is based on a current amplitude of the transmit signal.

In example 13, the subject matter of one of the previous examples can optionally include the power supply module comprises a DC-DC-converter module configured to provide a varying supply voltage to the power amplifier module.

In example 14, the subject matter of one of the previous examples can optionally include the power amplifier module is coupled to an antenna module comprising a duplexer module.

In example 15, the subject matter of one of the previous examples can optionally including the duplexer module provides a stronger frequency dependency of the delay between the transmit path and the envelope tracking path than other modules coupled to an output of the power amplifier module.

In example 16, the subject matter of one of the previous examples can optionally including the duplexer module provides a stronger frequency dependency of the delay between the transmit path and the envelope tracking path than a varying antenna load.

In example 17, the subject matter of one of the previous examples can optionally include a signal conversion module of the transmit path configured to generate the transmit signal provided to the power amplifier module based on a baseband transmit signal.

In example 18, the subject matter of one of the previous examples can optionally include the variable delay module is configured to vary the signal delay within the envelope tracking path during transmission of the transmit signal.

Example 19 is an apparatus for determining values of a delay control parameter, the apparatus comprising a transmit path comprising a power amplifier module coupled to an antenna module, wherein the power amplifier module is configured to amplify a transmit signal, an envelope tracking path comprising a power supply module configured to vary a power supply of the power amplifier module and a delay determining module configured to determine a plurality of values of a delay control parameter corresponding to a plurality of delays between the transmit path and the envelope tracking path for a plurality of characteristic transmit frequencies.

Optionally, the delay determining module is configured to determine the plurality of values of the delay control parameter corresponding to a plurality of different delays between the transmit path and the envelope tracking path for a plurality of different characteristic transmit frequencies In example 20, the subject matter of one of the previous examples can optionally include a signal provider configured to provide a transmit signal with varying characteristic transmit frequency.

In example 21, the subject matter of one of the previous examples can optionally the delay determining module is configured to determine a plurality of delay control parameters for the plurality of characteristic transmit frequencies at least a part representing a plurality of upper frequencies, lower frequencies or center frequencies of subbands dividing possible transmit bands with equal width.

In example 22, the subject matter of one of the previous examples can optionally include the delay determining module is configured to determine a plurality of delay control parameters for the plurality of characteristic transmit frequencies at least a part representing substantially extreme values of a frequency depending group delay caused by components coupled to an output of the power amplifier module.

In example 23, the subject matter of one of the previous examples can optionally include the envelope tracking path comprises a variable delay module, wherein the variable delay module is configured to vary a signal delay within the envelope tracking path according to the delay control parameter, wherein the power supply module is configured to vary a power supply of the power amplifier module with a temporal alignment adjusted by the variable delay module.

In example 24, the subject matter of one of the previous examples can optionally include a delay control module configured to provide the delay control parameter based on a current characteristic transmit frequency of the transmit signal.

Example 25 is an apparatus for amplifying a transmit signal, the apparatus comprising a transmit path comprising means for power amplification to be coupled to an antenna module, wherein the means for power amplification are configured to amplify a transmit signal, an envelope tracking path comprising means for delay variation and means for power supply, wherein the means for delay variation are configured to vary a signal delay within the envelope tracking path according to a delay control parameter, wherein the means for power supply are configured to vary a power supply of the means for power amplification with a temporal alignment adjustable by the means for delay variation and means for delay control configured to provide the delay control parameter based on a current characteristic transmit frequency of the transmit signal.

In example 26, the subject matter of one of the previous examples can optionally include the current characteristic transmit frequency depends on a transmit band currently used for transmitting the transmit signal.

Example 27 is transmitter or a transceiver comprising an apparatus according the subject matter of any of the previous examples.

Example 28 is a mobile device comprising a transmitter, a receiver or a transceiver according to example 27.

An example relates to a cell phone comprising a transmitter, a receiver or a transceiver according to example 27.

Example 29 is a method for amplifying a transmit signal, the method comprising amplifying a transmit signal within a transmit path by a power amplifier, varying a signal delay within an envelope tracking path according to a delay control parameter, varying a power supply of the power amplifier with a temporal alignment adjustable by the varying signal delay and providing the delay control parameter based on a current characteristic transmit frequency of the transmit signal.

In example 30, the subject matter of one of the previous examples can optionally include the current characteristic transmit frequency depends on a transmit band currently used for transmitting the transmit signal.

In example 31, the subject matter of one of the previous examples can optionally include the current characteristic transmit frequency depends on a transmit band currently used for transmitting the transmit signal, a number of resource blocks currently used for transmitting the transmit signal and a current position of the used resource blocks within the used transmit band.

In example 32, the subject matter of one of the previous examples can optionally include the current characteristic transmit frequency is a center frequency of a currently used transmit band for transmitting the transmit signal or a center frequency of one or more resource blocks currently used for transmitting the transmit signal.

In example 33, the subject matter of one of the previous examples can optionally include storing a plurality of values of the delay control parameter associated to a plurality of different characteristic transmit frequencies.

In example 34, the subject matter of one of the previous examples can optionally include providing a value of the delay control parameter associated with a characteristic transmit frequency closest to the current characteristic transmit frequency.

In example 35, the subject matter of one of the previous examples can optionally include determining and providing an interpolated value based on an interpolation of a plurality of stored values associated with the plurality of characteristic transmit frequencies closest to the current characteristic transmit frequency.

In example 36, the subject matter of one of the previous examples can optionally include storing values of the delay control parameter associated with characteristic transmit frequencies at least a part representing a plurality of substantially upper frequencies, lower frequencies or center frequencies of subbands dividing a possible transmit band with substantially equal width.

In example 37, the subject matter of one of the previous examples can optionally include storing values of the delay control parameter associated with the plurality of characteristic transmit frequencies at least a part representing the plurality of substantially extreme values of a frequency depending group delay caused by at least one component coupled to an output of the power amplifier module.

Example 38 is a method for determining values of a delay control parameter, the method comprising amplifying a transmit signal within a transmit path by a power amplifier, varying a power supply of the power amplifier through an envelope tracking path and determining a plurality of values of a delay control parameter corresponding to a plurality of delays between the transmit path and the envelope tracking path for a plurality of characteristic transmit frequencies.

In example 39, the subject matter of one of the previous examples can optionally include providing a transmit signal with varying characteristic transmit frequency.

In example 40, the subject matter of one of the previous examples can optionally include determining delay control parameters for characteristic transmit frequencies at least a part representing upper frequencies, lower frequencies or center frequencies of subbands dividing possible transmit bands with equal width.

Example 41 is a machine readable storage medium including program code, when executed, to cause a machine to perform the method of example 29 or 38.

Example 42 is a machine readable storage including machine readable instructions, when executed, to implement a method or realize an apparatus as implemented by any one of examples 1-40.

Example 43 is a computer program having a program code for performing the method of example 29 or 38, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An apparatus for amplifying a transmit signal, the apparatus comprising:
   a transmit path comprising a power amplifier module configured to be coupled to an antenna module, wherein the power amplifier module is configured to amplify a transmit signal;
   an envelope tracking path comprising a variable delay module and a power supply module, wherein the variable delay module is configured to vary a signal delay within the envelope tracking path according to a delay control parameter; and
   delay control circuitry configured to provide the delay control parameter based on a current characteristic transmit frequency of the transmit signal,
   wherein the current characteristic transmit frequency depends on a transmit band currently used for transmitting the transmit signal, a number of resource blocks currently used for transmitting the transmit signal and a current position of the used resource blocks within the used transmit band.

2. The apparatus according to claim 1, wherein the current characteristic transmit frequency is a center frequency of a currently used transmit band for transmitting the transmit signal or a center frequency of one or more resource blocks currently used for transmitting the transmit signal.

3. The apparatus according to claim 1, wherein the delay control circuitry comprises a memory module storing a plurality of values of the delay control parameter associated to a plurality of different characteristic transmit frequencies.

4. The apparatus according to claim 3, wherein the delay control circuitry is configured to provide a value of the delay control parameter associated with a characteristic transmit frequency closest to the current characteristic transmit frequency.

5. The apparatus according to claim 3, wherein the delay control circuitry is configured to determine and provide an interpolated value based on an interpolation of two stored values associated with the two characteristic transmit frequencies closest to the current characteristic transmit frequency.

6. The apparatus according to claim 3, wherein the memory module stores values of the delay control parameter associated with characteristic transmit frequencies at least a part representing substantially upper frequencies, lower frequencies or center frequencies of subbands dividing a possible transmit band with substantially equal width or with predefined partitioning.

7. The apparatus according to claim 3, wherein the memory module stores values of the delay control parameter associated with characteristic transmit frequencies at least a part representing substantially extreme values of a frequency depending group delay caused by at least one component coupled to an output of the power amplifier module.

8. The apparatus according to claim 1, wherein the power supply module is configured to vary a power supply of the power amplifier module with a temporal alignment adjustable by the variable delay module.

9. The apparatus according to claim 1, comprising an envelope tracking module within the envelope tracking path configured to determine a transmit signal envelope information based on a baseband transmit signal corresponding to the transmit signal, wherein the power supply module is configured to vary the power supply based on the transmit signal envelope information.

10. The apparatus according to claim 9, wherein the variable delay module is configured to vary a delay of the baseband transmit signal, a signal derived from the baseband transmit signal for determining the transmit signal envelope information or the transmit signal envelope information.

11. The apparatus according to claim 1, wherein the transmit signal envelope information is based on a current amplitude of the transmit signal.

12. The apparatus according to claim 1, wherein the power supply module comprises a DC-DC-converter module configured to provide a varying supply voltage to the power amplifier module.

13. The apparatus according to claim 1, wherein the variable delay module is configured to vary the signal delay within the envelope tracking path during transmission of the transmit signal.

14. An apparatus for determining values of a delay control parameter, the apparatus comprising:
   a transmit path comprising a power amplifier module coupled to an antenna module, wherein the power amplifier module is configured to amplify a transmit signal;
   an envelope tracking path comprising a power supply module configured to vary a power supply of the power amplifier module; and
   delay determining circuitry configured to determine a plurality of values of a delay control parameter corresponding to a plurality of delays between the transmit path and the envelope tracking path for a plurality of characteristic transmit frequencies,
   wherein the delay determining circuitry is configured to determine the plurality of values of the delay control parameter corresponding to a plurality of different delays between the transmit path and the envelope tracking path for a plurality of different characteristic transmit frequencies, and
   wherein the delay determining circuitry is configured to determine a plurality of delay control parameters for the plurality of characteristic transmit frequencies, wherein at least a part of the plurality of characteristic transmit frequencies represent a plurality of upper frequencies, lower frequencies or center frequencies of subbands dividing possible transmit bands with equal width.

15. The apparatus according to claim 14, comprising a signal provider configured to provide a transmit signal with varying characteristic transmit frequency.

16. The apparatus according to claim 14, wherein the delay determining circuitry is configured to determine a plurality of delay control parameters for the plurality of characteristic transmit frequencies at least a part representing substantially extreme values of a frequency depending group delay caused by components coupled to an output of the power amplifier module.

17. The apparatus according to claim 14, wherein the envelope tracking path comprises a variable delay module, wherein the variable delay module is configured to vary a signal delay within the envelope tracking path according to the delay control parameter, wherein the power supply module is configured to vary a power supply of the power amplifier module with a temporal alignment adjusted by the variable delay module.

18. The apparatus according to claim 17, comprising delay control circuitry configured to provide the delay control parameter based on a current characteristic transmit frequency of the transmit signal.

19. A method for amplifying a transmit signal, the method comprising:
   amplifying a transmit signal within a transmit path by a power amplifier;
   varying a signal delay within an envelope tracking path according to a delay control parameter; and
   providing the delay control parameter based on a current characteristic transmit frequency of the transmit signal,
   wherein the current characteristic transmit frequency depends on a transmit band currently used for transmitting the transmit signal, a number of resource blocks currently used for transmitting the transmit signal and a current position of the used resource blocks within the used transmit band.

20. A method for determining values of a delay control parameter, the method comprising:
   amplifying a transmit signal within a transmit path by a power amplifier;
   varying a power supply of the power amplifier through an envelope tracking path;
   determining a plurality of values of a delay control parameter corresponding to a plurality of delays between the transmit path and the envelope tracking path for a plurality of characteristic transmit frequencies, and
   varying a signal delay within an envelope tracking path according to a selected of the delay control parameter, wherein the selected value of the delay control parameter is associated with a characteristic transmit frequency closest to a current characteristic transmit frequency.

* * * * *